United States Patent
Sakui et al.

(10) Patent No.: US 12,376,284 B2
(45) Date of Patent: *Jul. 29, 2025

(54) MEMORY DEVICE USING DYNAMIC FLASH MEMORY CELLS

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 137 days.

This patent is subject to a terminal disclaimer.

(21) Appl. No.: 17/961,353

(22) Filed: Oct. 6, 2022

(65) Prior Publication Data
US 2023/0115460 A1    Apr. 13, 2023

(30) Foreign Application Priority Data
Oct. 8, 2021    (WO) .................. PCT/JP2021/037416

(51) Int. Cl.
*H10B 12/00*    (2023.01)
*G11C 11/404*   (2006.01)
(Continued)

(52) U.S. Cl.
CPC ............ *H10B 12/20* (2023.02); *G11C 11/404* (2013.01); *G11C 11/4087* (2013.01); *G11C 11/4091* (2013.01); *G11C 11/4096* (2013.01)

(58) Field of Classification Search
CPC ... H10B 12/20; G11C 11/404; G11C 11/4087; G11C 11/4091; G11C 11/4096
See application file for complete search history.

(56) References Cited

U.S. PATENT DOCUMENTS 5,373,475 A *  12/1994  Nagase ................. G11C 11/406
                                          365/230.03
8,441,053 B2 *  5/2013  Chen ...................... H10B 12/20
                                          365/182
(Continued)

FOREIGN PATENT DOCUMENTS

JP    H 02-188966 A    7/1990
JP    H 03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor (SGT) for Ultra-High Density LSI's", IEEE Transaction on Electron Devices, vol. 38, No. 3, pp. 573-578 (1991).

(Continued)

*Primary Examiner* — Vanthu T Nguyen
(74) *Attorney, Agent, or Firm* — Crowell & Moring LLP

(57) ABSTRACT

A memory device includes a page constituted by multiple memory cells arranged in a row form on a substrate, and performs a page write operation of controlling voltages to be applied to first and second gate conductor layers and first and second impurity layers of each memory cell included in the page to hold a positive hole group formed by an impact ionization phenomenon inside a channel semiconductor layer; During a page read operation, page data of a memory cell group selected with the word line is read to the sense amplifier circuit, and a refresh operation is performed at least once before the page read operation to hold a positive hole group formed by an impact ionization phenomenon inside a channel semiconductor layer.

9 Claims, 26 Drawing Sheets

(51) Int. Cl.
  *G11C 11/408* (2006.01)
  *G11C 11/4091* (2006.01)
  *G11C 11/4096* (2006.01)

(56) References Cited

U.S. PATENT DOCUMENTS

| | | | |
|---|---|---|---|
| 10,854,745 B2 * | 12/2020 | Han | H01L 27/1211 |
| 2003/0111681 A1 | 7/2003 | Kawanaka | |
| 2006/0049444 A1 | 3/2006 | Shino | |
| 2006/0157738 A1 | 7/2006 | Kawanaka | |
| 2008/0137394 A1 | 6/2008 | Shimano et al. | |
| 2008/0212366 A1 | 9/2008 | Ohsawa | |

FOREIGN PATENT DOCUMENTS

| | | | |
|---|---|---|---|
| JP | 2003-188279 | | 7/2003 |
| JP | 2006-080280 | A | 3/2006 |
| JP | 2008-147514 | A | 6/2006 |
| JP | 3957774 | B2 | 5/2007 |
| JP | 2008-218556 | A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 Dram Cell with Vertical Pillar Transistor (VPT)," 2011 Proceeding of the European Solid-State Device Research Conference, (2011).
H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).
K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) pp. 767-770.
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi, "Memory design using a one-transistor gain cell on SOI", IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM 4 pgs. (2006).
E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
H. Jiang, N. Xu, B. Chen, L. Zeng, Y. He, G. Du, X. Liu and X. Zhang: "Experimental investigation of self heating effect (SHE) in multiple-fin SOI FinFETs", Semicond. Sci. Technol. 29 (2014) 115021, 9 pgs.
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., vol. E90-C, No. 4 pp. 765-771 (2007).
International Search Report (PCT/ISA/210) (Japanese) from PCT/JP2021/037416 dated Nov. 22, 2021, 4 pgs.
English translation of International Search Report (PCT/ISA/210) from PCT/JP2021/037416 dated Nov. 22, 2021, 2 pgs.
International Written Opinion (PCT/ISA/237) (Japanese) from PCT/JP2021/037416 dated Nov. 22, 2021, 3 pgs.

* cited by examiner

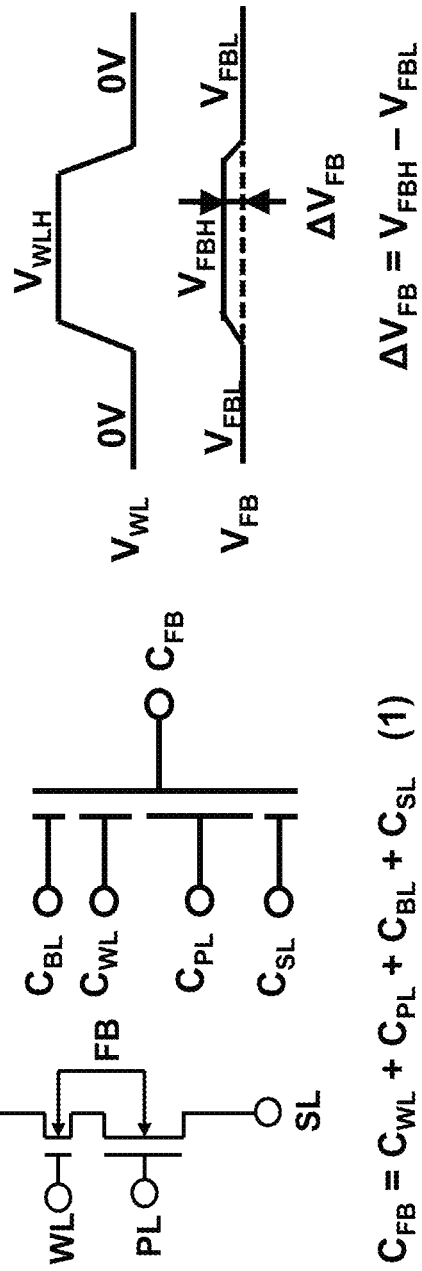

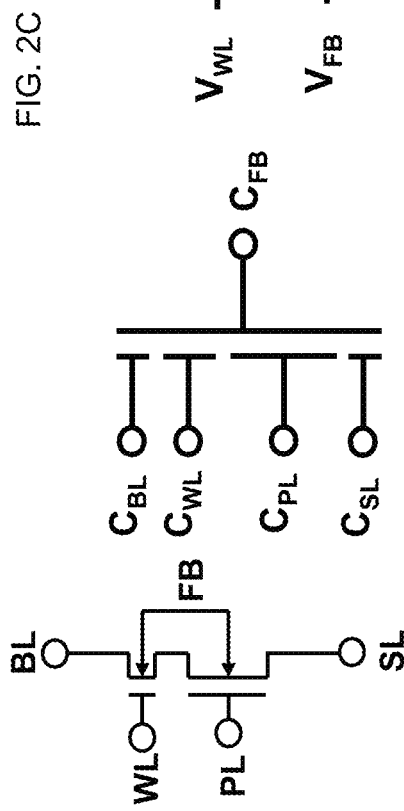

FIG. 2C

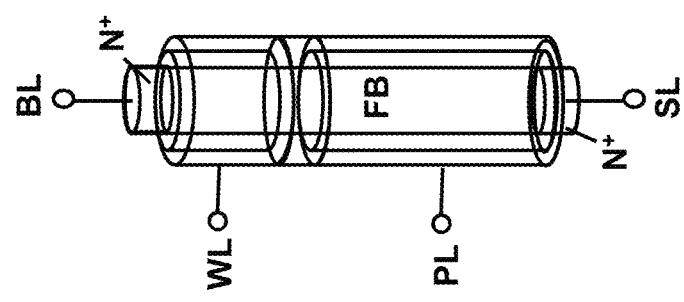

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{SMALL } \beta_{WL}$$

$$\beta_{PL} = \frac{C_{PL}}{C_{WL} + C_{PL} + C_{BL} + C_{SL}} \quad (3) \Rightarrow \text{LARGE } \beta_{PL}$$

$$\beta_{BL} = \frac{C_{BL}}{C_{WL} + C_{PL} + C_{BL} + C_{SL}} \quad (4) \Rightarrow \text{SMALL } \beta_{BL}$$

$$\beta_{SL} = \frac{C_{SL}}{C_{WL} + C_{PL} + C_{BL} + C_{SL}} \quad (5) \Rightarrow \text{SMALL } \beta_{SL}$$

$$\Delta V_{FB} = V_{FBH} - V_{FBL}$$
$$= \underline{\beta_{WL} \times V_{WLH}} \quad (6)$$
$$\phantom{= }\text{SMALL}$$

FIG. 3AA  "1" PAGE WRITE OPERATION
SOURCE-SIDE IMPACT IONIZATION
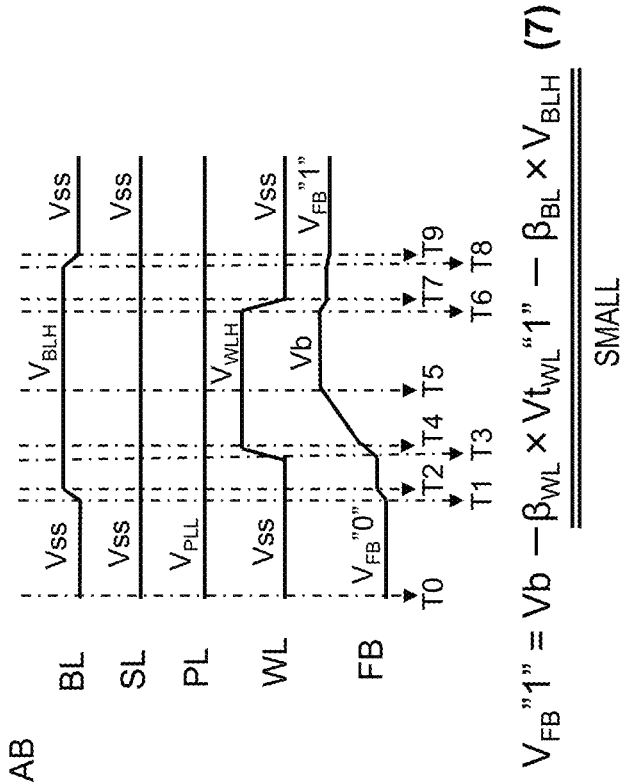
FIG. 3AB
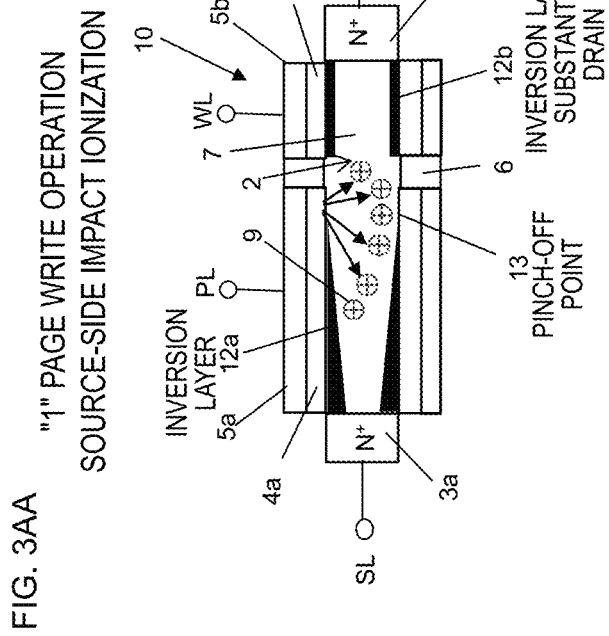
$$V_{FB}"1" = Vb - \beta_{WL} \times Vt_{WL}"1" - \beta_{BL} \times V_{BLH} \quad (7)$$
SMALL
FIG. 3AC  "1" WRITE STATE
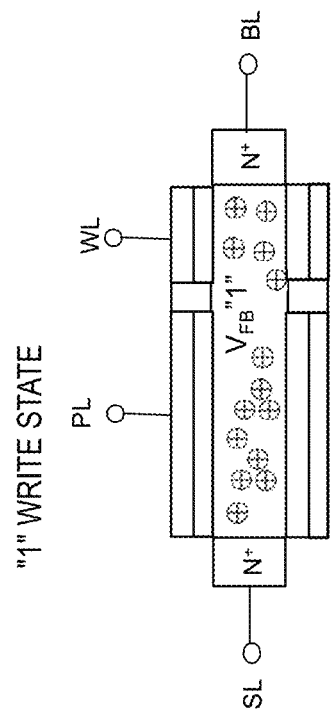

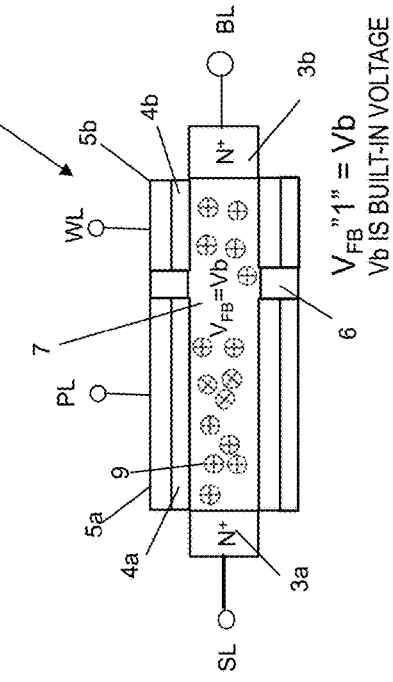

FIG. 4BB  "1" WRITE STATE (T0)

$$V_{FB}\text{``1''} = V_b$$

Vb IS BUILT-IN VOLTAGE

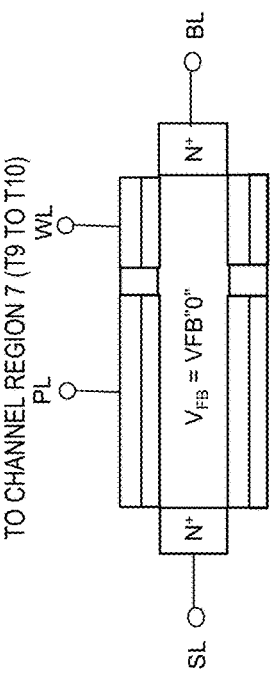

$$V_{FB}\text{``1''} = V_b - \beta_{WL} \times Vt_{WL}\text{``1''} - \beta_{BL} \times V_{BLH} \quad (7)$$

$$V_{FB}\text{``0''} = V_b - \beta_{WL} \times V_{WLH} - \beta_{PL} \times (V_{PLH} - V_{PLL}) \quad (8)$$

$$\Delta V_{FB} = V_{FB}\text{``1''} - V_{FB}\text{``0''}$$
$$= \beta_{WL} \times V_{WLH} + \beta_{PL} \times (V_{PLH} - V_{PLL}) - \beta_{WL} \times Vt_{WL}\text{``1''} - \beta_{BL} \times V_{BLH} \quad (9)$$

IN "0" ERASE OPERATION, WORD LINE WL AND PLATE LINE PL ARE CAPACITIVELY COUPLED TO CHANNEL REGION 7 (T9 TO T10)

FIG. 4BD

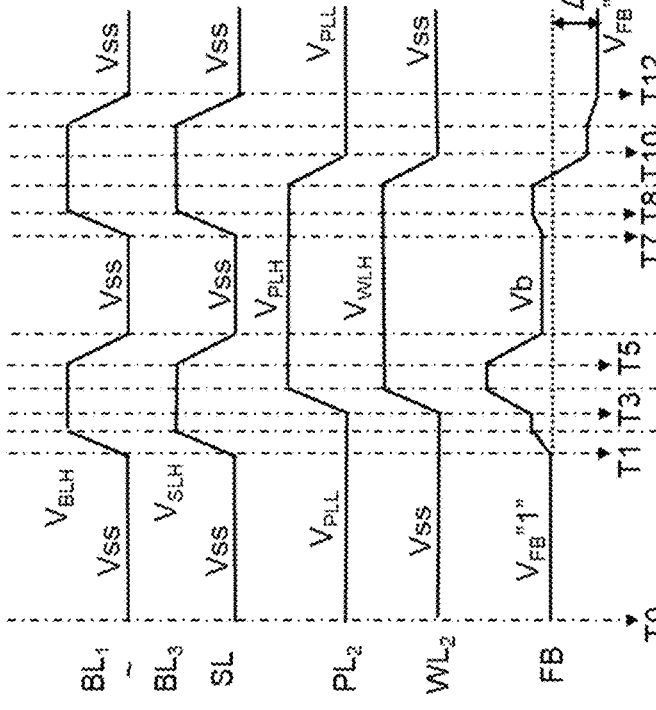

FIG. 4BA  "0" PAGE ERASE OPERATION TIMING CHART

T3 TO T4: FIRST PERIOD
T5 TO T6: SECOND PERIOD
T9 TO T10: THIRD PERIOD

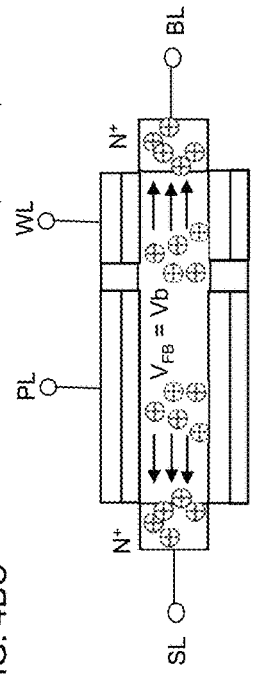

IN "0" ERASE OPERATION, POSITIVE HOLE GROUP 9 IS DISCHARGED (T5 TO T6)

FIG. 4BC

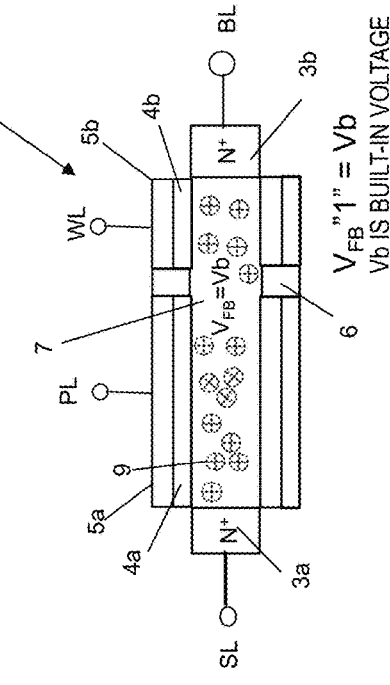

FIG. 4DA "0" PAGE ERASE OPERATION TIMING CHART

T3 TO T4: FIRST PERIOD
T5 TO T6: SECOND PERIOD
T9 TO T10: THIRD PERIOD

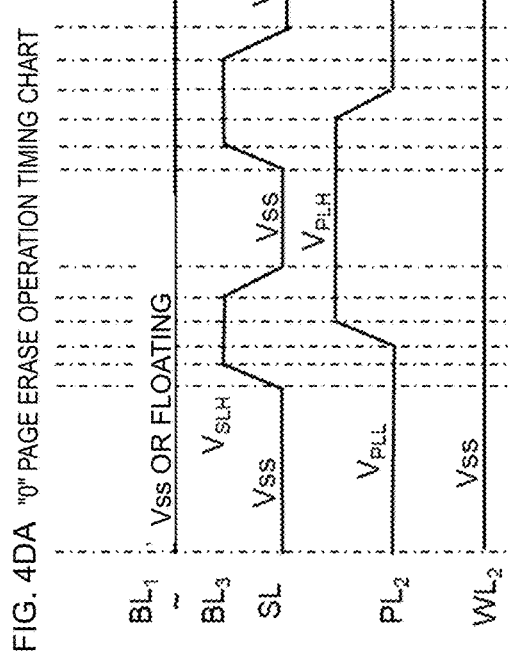

FIG. 4DC IN "0" ERASE OPERATION, POSITIVE HOLE GROUP 9 IS DISCHARGED (T5 TO T6)

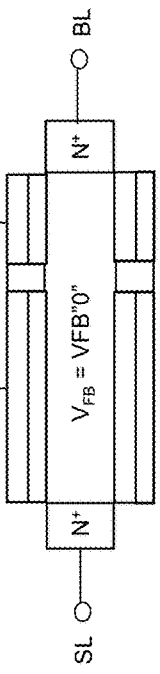

FIG. 4DB "1" WRITE STATE (T0)

$V_{FB}\text{"1"} = V_b$
$V_b$ IS BUILT-IN VOLTAGE $V_{FB}\text{"1"} = V_b - \beta_{WL} \times Vt_{WL}\text{"1"} - \beta_{BL} \times V_{BLH}$ (7)

$V_{FB}\text{"0"} = V_b - \beta_{WL} \times V_{WLH} - \beta_{PL} \times (V_{PLH} - V_{PLL})$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL})$
$- \beta_{WL} \times Vt_{WL}\text{"1"} - \beta_{BL} \times V_{BLH}$ (9)

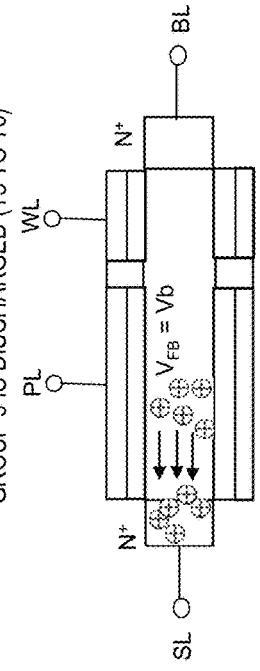

FIG. 4DD IN "0" ERASE OPERATION, WORD LINE WL AND PLATE LINE PL ARE CAPACITIVELY COUPLED TO CHANNEL REGION 7 (T9 TO T10)

Vb: BUILT-IN VOLTAGE TO 0.7 V

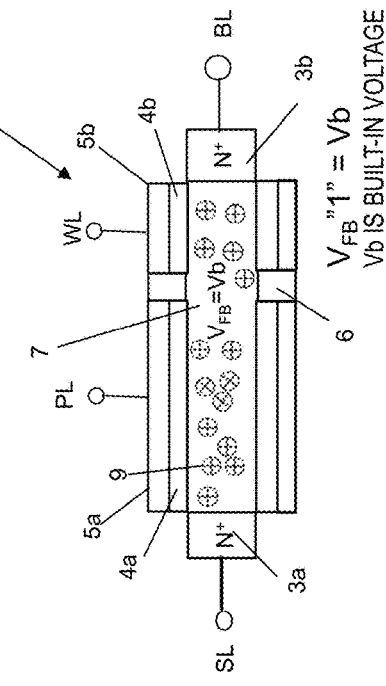

FIG. 4EA "0" PAGE ERASE OPERATION TIMING CHART

T3 TO T4: FIRST PERIOD
T5 TO T6: SECOND PERIOD
T9 TO T10: THIRD PERIOD

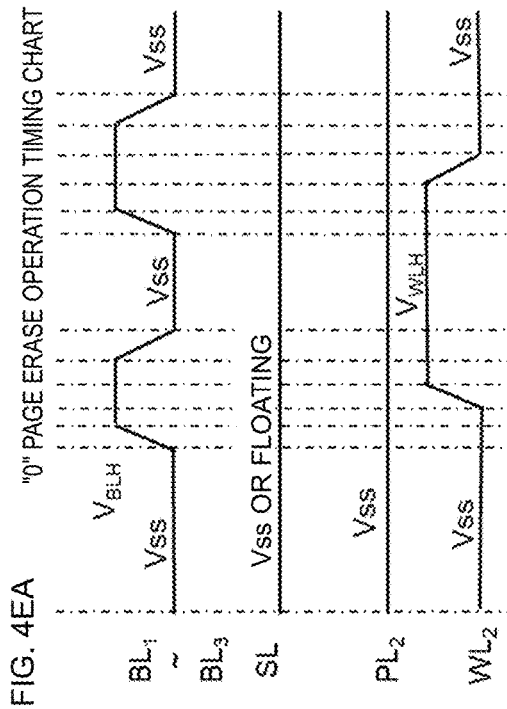

FIG. 4EB "1" WRITE STATE (T0)

$V_{FB} \text{"1"} = Vb$
Vb IS BUILT-IN VOLTAGE $V_{FB}\text{"1"} = Vb - \beta_{WL} \times Vt_{WL}\text{"1"} - \beta_{BL} \times V_{BLH}$ (7)

$V_{FB}\text{"0"} = Vb - \beta_{WL} \times V_{WLH} - \beta_{PL} \times (V_{PLH} - V_{PLL})$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL})$
$\quad - \beta_{WL} \times Vt_{WL}\text{"1"} - \beta_{BL} \times V_{BLH}$ (9)

FIG. 4EC IN "0" ERASE OPERATION, POSITIVE HOLE GROUP 9 IS DISCHARGED (T5 TO T6)

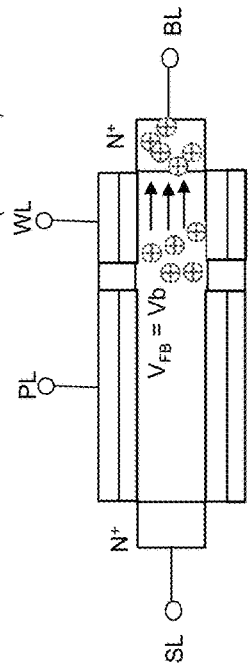

FIG. 4ED IN "0" ERASE OPERATION, WORD LINE WL AND PLATE LINE PL ARE CAPACITIVELY COUPLED TO CHANNEL REGION 7 (T9 TO T10)

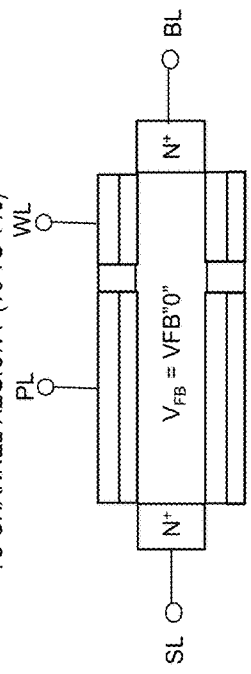

Vb: BUILT-IN VOLTAGE TO 0.7 V

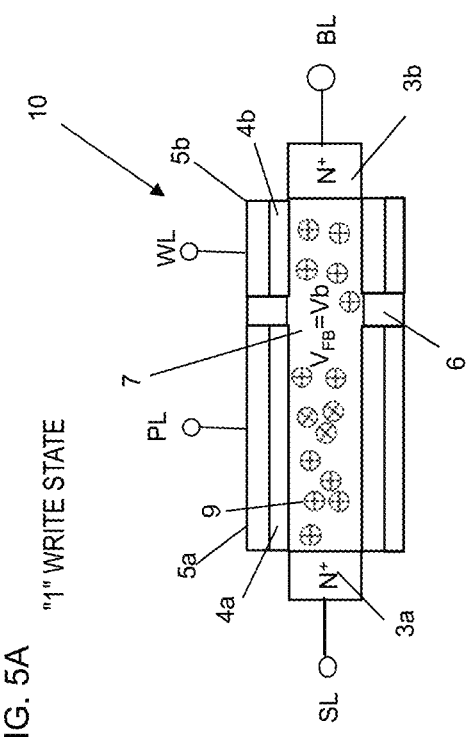
FIG. 5A "1" WRITE STATE
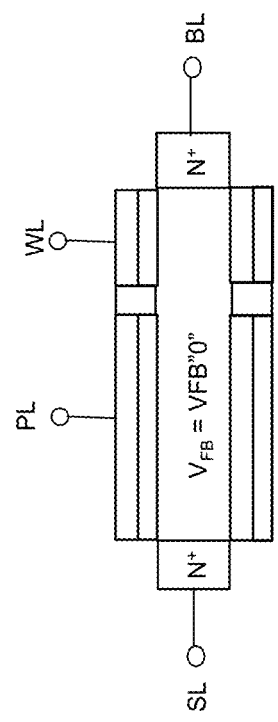
FIG. 5B "0" ERASE STATE
Vb: BUILT-IN VOLTAGE TO 0.7 V
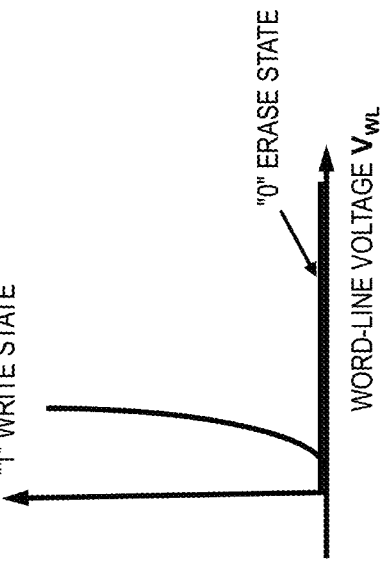
FIG. 5C $$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

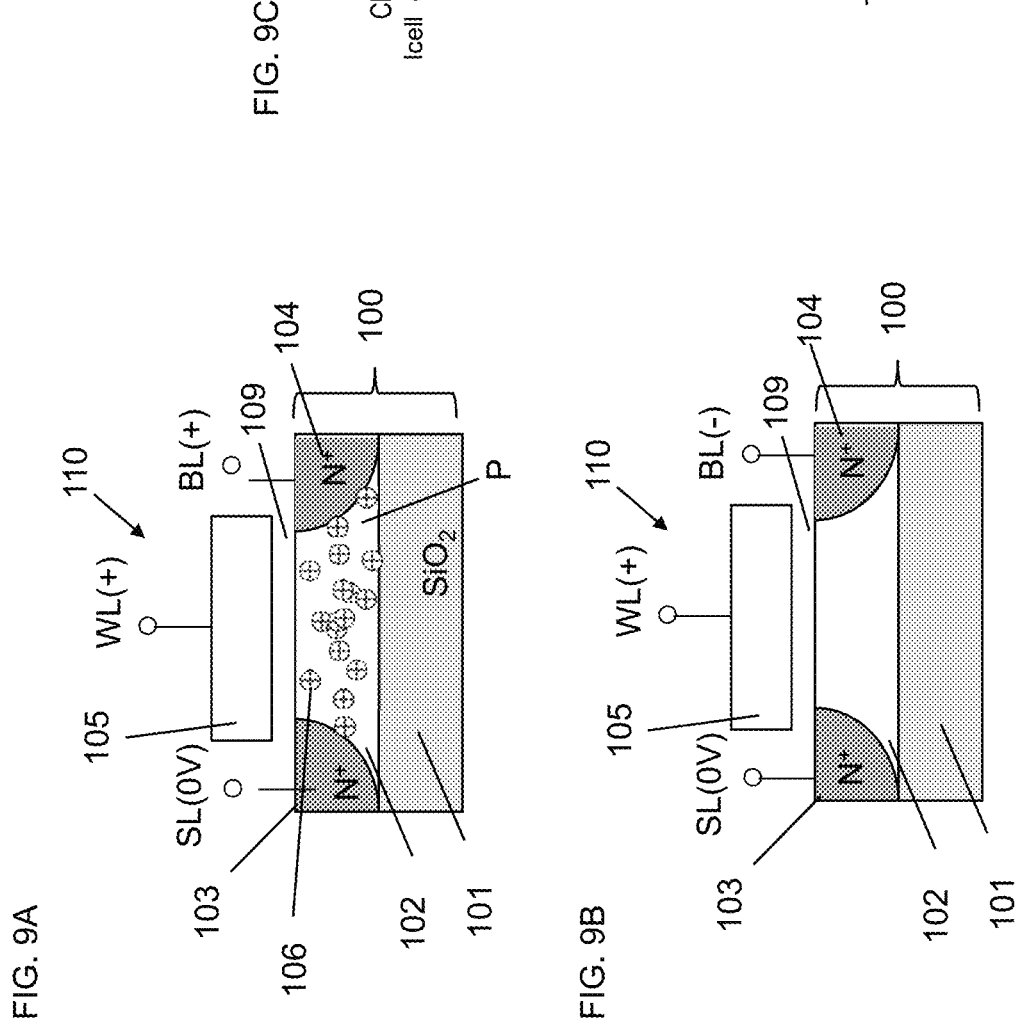

MEMORY DEVICE USING DYNAMIC FLASH MEMORY CELLS

RELATED APPLICATIONS

This application claims priority to PCT/JP2021/037416, filed on Oct. 8, 2021, the entire content of which is incorporated herein by reference.

BACKGROUND OF THE INVENTION

1. Field of the Invention

The present invention relates to a memory device using a semiconductor element.

2. Description of the Related Art

In recent years, an increase in density of integration and an increase in performance of memory elements have been desired in technical development for large scale integration (LSI).

In a typical planar metal oxide semiconductor (MOS) transistor, a channel extends in a horizontal direction along an upper surface of a semiconductor substrate. In contrast, a channel of a surrounding gate transistor (SGT) extends in a vertical direction with respect to an upper surface of a semiconductor substrate (for example, see Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, it is possible to increase the density of a semiconductor device of the SGT compared to the planar MOS transistor. Using the SGT as a select transistor, the density of integration can be increased for a dynamic random access memory (DRAM) to which a capacitor is connected (for example, see H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)), a phase change memory (PCM) to which a variable resistance element is connected (for example, see H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)), a resistive random access memory (RRAM) (for example, see T. Tsunoda, K. Kinoshita, H. Noshiro, Y. Yamazaki, T. Tizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and a magneto-resistive random access memory (MRAM) (for example, see W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the direction of a magnetic spin with electric current. There is also a capacitorless DRAM memory cell (see J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012)) or the like constituted by one MOS transistor. The present application relates to a dynamic flash memory having no variable resistance element or capacitor but being able to be constituted only by a MOS transistor.

FIGS. 7A to 7D illustrate a write operation of the above-described capacitorless DRAM memory cell constituted by one MOS transistor, FIGS. 8A and 8B illustrate a problem in the operation, and FIGS. 9A to 9C illustrate a read operation (see J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006); and E. Yoshida and T. Tanaka: "A design of a capacitorless 1T-DRAM cell using gate-induced drain leakage (GIDL) current for low-power and high-speed embedded memory", IEEE IEDM, pp. 913-916, December 2003). FIG. 7A indicates a "1" write state. Here, the memory cell is formed in a silicon on insulator (SOI) substrate 100, and is constituted by a source $N^+$ layer 103 (hereinafter, a semiconductor region containing a donor impurity with a high density is referred to as an "$N^+$ layer") connected to a source line SL, a drain $N^+$ layer 104 connected to a bit line BL, a gate conductive layer 105 connected to a word line WL, and a floating body 102 of a MOS transistor 110. Hence, a capacitorless DRAM memory cell having one MOS transistor 110 is constituted. A $SiO_2$ layer 101 of the SOI substrate is in contact directly below the floating body 102. When "1" writing is performed in the memory cell constituted by the one MOS transistor 110, the MOS transistor 110 is operated in a saturation region. That is, a channel 107 of electrons extending from the source $N^+$ layer 103 has a pinch-off point 108, and does not reach the drain $N^+$ layer 104 connected to the bit line BL. When the voltage of the bit line BL connected to the drain $N^+$ layer 104 and the word line WL connected to the gate conductive layer 105 both are set to a high voltage to operate the MOS transistor 110 with the gate voltage being about ½ of the drain voltage, the field strength becomes the highest at the pinch-off point 108 near the drain $N^+$ layer 104. Consequently, accelerated electrons flowing from the source $N^+$ layer 103 to the drain $N^+$ layer 104 collide with the lattice of Si, and the kinetic energy lost at the time of collision generates electron-positive hole pairs (impact ionization phenomenon). Most electrons of the generated electrons (not illustrated) reach the drain $N^+$ layer 104. Some electrons that are very hot of the generated electrons jump over a gate oxide film 109 and reach the gate conductive layer 105. Positive holes 106 that are simultaneously generated charge the floating body 102. In this case, the generated positive holes 106 contribute to an increase of a majority carrier because the floating body 102 is P-type Si. When the floating body 102 is filled with the generated positive holes 106 and the voltage of the floating body 102 becomes higher than the voltage of the source $N^+$ layer 103 by Vb or more, further generated positive holes are discharged to the source $N^+$ layer 103. Here, Vb is a built-in voltage of PN junction between the source $N^+$ layer 103 and the floating body 102 that is a P layer, and is about 0.7 V. FIG. 7B illustrates a state in which the floating body 102 is charged in a saturated manner with the generated positive holes 106.

Next, a "0" write operation of a memory cell 110 is described with reference to FIG. 7C. A memory cell 110 of "1" writing and a memory cell 110 of "0" writing randomly present for a common select word line WL. FIG. 7C indicates a state in which a "1" write state changes to a "0" write state. During "0" writing, the voltage of the bit line BL is set to a negative bias, and the PN junction between the drain N+ layer 104 and the floating body 102 of the P layer is set to a forward bias. Consequently, positive holes 106 generated in the previous cycle in advance in the floating body 102 flow to the drain N+ layer 104 connected to the bit line BL. When the write operation is ended, two memory-cell states of the memory cell 110 (FIG. 7B) filled with the generated positive holes 106 and the memory cell 110 (FIG. 7C) from which the generated positive holes 106 are discharged are obtained. The potential of the floating body 102 of the memory cell 110 filled with the positive holes 106 is higher than the potential of the floating body 102 without the generated positive holes. Thus, the threshold voltage of the memory cell 110 of "1" writing is lower than the threshold voltage of the memory cell 110 of "0" writing. FIG. 7D illustrates that state.

Next, a problem in the operation of the memory cell constituted by the one MOS transistor 110 is described with reference to FIGS. 8A and 8B. As illustrated in FIG. 8A, a capacitance $C_{FB}$ of the floating body 102 is the sum total of a capacitance $C_{WL}$ between the floating body 102 and the gate connected to the word line WL, a junction capacitance $C_{SL}$ of PN junction between the floating body 102 and the source N+ layer 103 connected to the source line SL, and a junction capacitance $C_{BL}$ of PN junction between the floating body 102 and the drain N+ layer 104 connected to the bit line BL. The sum total is expressed as follows.

$$C_{FB}=C_{WL}+C_{BL}+C_{SL} \quad (10)$$

Also, a capacitive coupling ratio $\beta_{WF}$ between the floating body 102 and the gate connected to the word line WL is expressed as follows.

$$\beta_{WF}=C_{WL}(C_{WF}+C_{BL}+C_{SL}) \quad (11)$$

Accordingly, when a word-line voltage $V_{WL}$ oscillates during reading or writing, the voltage of the floating body 102 that serves as a storage node (contact) of the memory cell is also affected thereby. FIG. 8B illustrates that state. When the word-line voltage $V_{WL}$ rises from 0 V to $V_{WLH}$ during reading or writing, a voltage $V_{FB}$ of the floating body 102 rises from a voltage $V_{FB1}$ in an initial state before the word-line voltage changes to a voltage $V_{FB2}$ by capacitive coupling to the word line WL. A resultant voltage change amount $\Delta V_{FB}$ is expressed as follows.

$$\Delta V_{FB} = V_{FB2} - V_{FB1} = \beta_{WL} \times V_{WLH} \quad (12)$$

Here, $C_{WL}$ has a large contribution ratio for $\beta_{WL}$ of Expression (11). The ratio is, for example, $C_{WL}:C_{BL}:C_{SL}=8:1:1$. In this case, $\beta_{WL}=0.8$. When the voltage of the word line WL becomes 0 V after writing is ended from 5 V during writing, the floating body 102 receives an oscillation noise of 5 V×$\beta_{WL}=4$ V by capacitive coupling between the word line WL and the floating body 102. Thus, there has been a problem that it is difficult to sufficiently obtain a potential difference margin between a "1" potential and a "0" potential of the floating body 102 during writing.

FIGS. 9A to 9C illustrate a read operation. FIG. 9A indicates a "1" write state. FIG. 9B indicates a "0" write state. In fact, however, although Vb is written in the floating body 102 by "1" writing, once the word line WL returns to 0 V as the result of the end of writing, the floating body 102 is lowered to a negative bias. When "0" is written, the floating body 102 becomes a further negative bias. As illustrated in FIG. 9C, it is not possible to have a sufficiently large potential difference margin between "1" and "0" during writing, leading to a situation that it is difficult to actually commercialize a capacitorless DRAM memory cell.

Also, Japanese Unexamined Patent Application Publication No. 3-171768 and Japanese Patent No. 3957774 are disclosed as related art.

Further, M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010); N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017; and E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006 are disclosed as related art.

With the capacitorless one-transistor DRAM (gain cell) of the memory device, the capacitive coupling between the word line and the floating body is large, and hence when the potential of the word line oscillates during data reading or writing, there has been a problem that the capacitive coupling may be directly transmitted as a noise to the floating body. Consequently, the noise has caused a problem of erroneous reading or erroneous rewriting of stored data, and it has been difficult to bring a capacitorless one-transistor DRAM (gain cell) into actual use.

SUMMARY OF THE INVENTION

To address the above-described problem, a memory device using a semiconductor element according to an aspect of the present invention is a memory device in which a plurality of memory cells arranged in a row direction on a substrate constitute a page, and a plurality of the pages arranged in a column direction constitute a memory block.

Each of the memory cells included in each of the pages includes a semiconductor body standing in a vertical direction or extending in a horizontal direction with respect to the substrate on the substrate, a first impurity layer and a second impurity layer at both ends of the semiconductor body, a first gate insulating layer that surrounds a portion or a whole of a side surface of the semiconductor body between the first impurity layer and the second impurity layer and is in contact with or close to the first impurity layer, a second gate insulating layer that surrounds the side surface of the semiconductor body, is connected to the first gate insulating layer, and is in contact with or close to the second impurity layer, a first gate conductor layer covering a portion or a whole of the first gate insulating layer, a second gate conductor layer covering the second gate insulating layer, and a channel semiconductor layer in which the semiconductor body is covered with the first gate insulating layer and the second gate insulating layer.

Voltages to be applied to the first gate conductor layer, the second gate conductor layer, the first impurity layer, and the second impurity layer are controlled to hold a positive hole group formed by an impact ionization phenomenon inside the channel semiconductor layer.

During a page write operation, a voltage of the channel semiconductor layer is set to a first data holding voltage that is higher than one or both of the voltages of the first impurity layer and the second impurity layer.

During a page erase operation, the voltages to be applied to the first impurity layer, the second impurity layer, the first gate conductor layer, and the second gate conductor layer are controlled to discharge the positive hole group from one or both of the first impurity layer and the second impurity layer and to set the voltage of the channel semiconductor layer to a second data holding voltage that is lower than the first data holding voltage.

Of the memory cell, the first impurity layer is connected to a source line, the second impurity layer is connected to a bit line, one of the first gate conductor layer and the second gate conductor layer is connected to a word line, the other is connected to a drive control line, and the bit line is connected to a sense amplifier circuit via a switch circuit.

During a page read operation, in an operation of reading page data of a memory cell group selected with at least one of the word lines to the bit line, a refresh operation of returning the voltage of the channel semiconductor layer of the selected word line to the first data holding voltage through formation of the positive hole group by the impact ionization phenomenon inside the channel semiconductor layer is performed at least once before the page read operation (first aspect of invention).

In the first aspect of the invention, the memory device may further include a row decoder circuit. During the refresh operation, a word-line all select signal may be input to the row decoder circuit, and all the word lines in the memory cell block may be selected (second aspect of invention).

In the first aspect of the invention, the drive control line of the memory cells arranged in the row direction and the column direction may be disposed commonly to the adjacent memory cells (third aspect of invention).

In the first aspect of the invention, the switch circuit may be set to a non-conductive state, the page data may be written in the sense amplifier circuit during the refresh operation, the page erase operation of the first page may be performed after the refresh operation is ended, the switch circuit may be set to a conductive state, and the page write operation of writing the page data of the sense amplifier circuit in the first memory cell group may be performed (fourth aspect of invention).

In the first aspect of the invention, a first gate capacitance between the first gate conductor layer and the channel semiconductor layer may be larger than a second gate capacitance between the second gate conductor layer and the channel semiconductor layer (fifth aspect of invention).

In the first aspect of the invention, when viewed in an axial direction of the semiconductor body, the first gate conductor layer may surround the first gate insulating layer and may be separated into at least two conductor layers (sixth aspect of invention).

In the first aspect of the invention, a first pulse width of the word line and the bit line during the refresh operation may be larger than a second pulse width of the word line and the bit line during the page read operation (seventh aspect of invention).

In the first aspect of the invention, the impact ionization phenomenon may occur inside the channel semiconductor layer between the first gate conductor layer and the second gate conductor layer to generate the positive hole group inside the channel semiconductor layer (eighth aspect of invention).

In the first aspect of the invention, during a page sum-of-product read operation in which at least two of the word lines are multiple-selected, the refresh operation may be performed at least once in advance for the word lines multiple-selected in the page sum-of-product read operation (ninth aspect of invention).

BRIEF DESCRIPTION OF THE DRAWINGS

FIGS. 2A, 2B, and 2C are diagrams explaining an effect in a case where the gate capacitance of a first gate conductor layer connected to a plate line of the memory device having the SGT according to the first embodiment is larger than the gate capacitance of a second gate conductor layer connected to a word line of the memory device.

FIGS. 3AA, 3AB, and 3AC are diagrams for explaining a write operation mechanism of the memory device having the SGT according to the first embodiment.

FIGS. 4BA, 4BB, 4BC, and 4BD are diagrams for explaining the page erase operation mechanism of the memory device having the SGT according to the first embodiment.

FIGS. 4DA, 4DB, 4DC, and 4DD are diagrams for explaining a page erase operation mechanism of the memory device having the SGT according to the first embodiment.

FIGS. 4EA, 4EB, 4EC, and 4ED are diagrams for explaining a page erase operation mechanism of the memory device having the SGT according to the first embodiment.

FIGS. 5A, 5B, and 5C are diagrams for explaining a read operation mechanism of the memory device having the SGT according to the first embodiment.

FIGS. 9A, 9B, and 9C are diagrams illustrating a read operation of the capacitorless DRAM memory cell according to the related art.

DETAILED DESCRIPTION OF THE PREFERRED EMBODIMENTS

A memory device (hereinafter, referred to as a dynamic flash memory) using a semiconductor element according to an embodiment of the present invention will be described below with reference to the drawings.

First Embodiment

A structure and an operation mechanism of a dynamic flash memory cell according to a first embodiment of the present invention is described with reference to FIGS. 1 to 5C. The structure of the dynamic flash memory cell will be described with reference to FIG. 1. Then, an effect of a case where the gate capacitance of a first gate conductor layer 5a connected to a plate line PL is larger than the gate capacitance of a second gate conductor layer 5b connected to a word line WL will be described with reference to FIGS. 2A to 2C. Then, a data write operation mechanism will be described with reference to FIGS. 3AA to 3B, a data erase operation mechanism will be described with reference to FIGS. 4A to 4ED, and a data read operation mechanism will be described with reference to FIGS. 5A to 5C.

Figure 1:
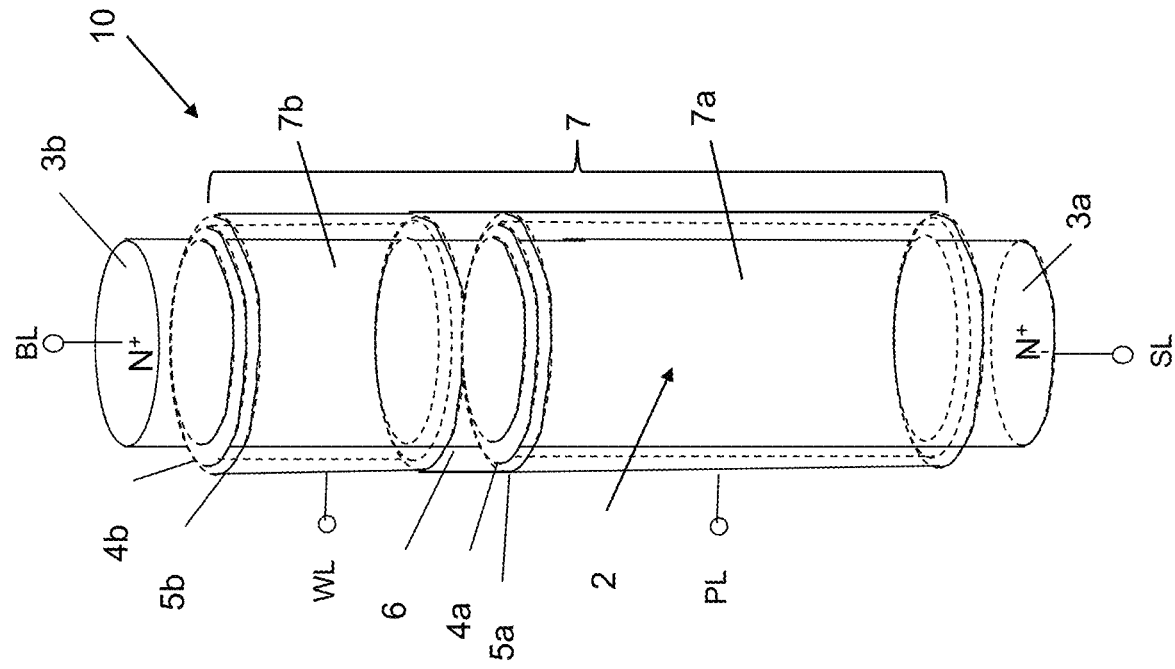
FIG. 1 is a structural diagram of a memory device having a SGT according to a first embodiment.

FIG. 1 illustrates the structure of the dynamic flash memory cell according to the first embodiment of the present invention. N$^+$ layers 3a and 3b (examples of a "first impurity layer" and a "second impurity layer" in the claims) are formed on a substrate at upper and lower positions in a silicon semiconductor pillar 2 (hereinafter, the silicon semiconductor pillar is referred to as a "Si pillar") (an example of a "semiconductor body" in the claims). The Si pillar 2 has a conductivity type of P type or i type (intrinsic type). One of the N$^+$ layers 3a and 3b serves as a source and the other serves as a drain. A portion of the Si pillar 2 between the N$^+$ layers 3a and 3b serving as the source and the drain is a channel region 7 (an example of a "channel semiconductor layer" in the claims). A first gate insulating layer 4a (an example of a "first gate insulating layer" in the claims) and a second gate insulating layer 4b (an example of a "second gate insulating layer" in the claims) are formed to surround the channel region 7. The first gate insulating layer 4a and the second gate insulating layer 4b are in contact with or close to the N$^+$ layers 3a and 3b serving as the source and the drain, respectively. A first gate conductor layer 5a (an example of a "first gate conductor layer" in the claims) and a second gate conductor layer 5b (an example of a "second gate conductor layer" in the claims) are formed to surround the first gate insulating layer 4a and the second gate insulating layer 4b, respectively. The first gate conductor layer 5a and the second gate conductor layer 5b are isolated by an insulating layer 6 (an example of a "first insulating layer" in the claims). The channel region 7 between the N$^+$ layers 3a and 3b includes a first channel Si layer 7a surrounded by the first gate insulating layer 4a, and a second channel Si layer 7b surrounded by the second gate insulating layer 4b. Accordingly, a dynamic flash memory cell 10 including the N$^+$ layers 3a and 3b serving as the source and the drain, the channel region 7, the first gate insulating layer 4a, the second gate insulating layer 4b, the first gate conductor layer 5a, and the second gate conductor layer 5b is formed. The N$^+$ layer 3a serving as the source is connected to a source line SL (an example of a "source line" in the claims). The N$^+$ layer 3b serving as the drain is connected to a bit line BL (an example of a "bit line" in the claims). The first gate conductor layer 5a is connected to a plate line PL (an example of a "first drive control line" in the claims). The second gate conductor layer 5b is connected to a word line WL (an example of a "word line" in the claims). A structure is desirable in which the gate capacitance of the first gate conductor layer 5a connected to the plate line PL is larger than the gate capacitance of the second gate conductor layer 5b connected to the word line WL.

In FIG. 1, the gate length of the first gate conductor layer 5a is larger than the gate length of the second gate conductor layer 5b so that the gate capacitance of the first gate conductor layer 5a connected to the plate line PL is larger than the gate capacitance of the second gate conductor layer 5b connected to the word line WL. However, alternatively, instead of making the gate length of the first gate conductor layer 5a larger than the gate length of the second gate conductor layer 5b, the film thicknesses of the respective gate insulating layers may be changed so that the film thickness of a gate insulating film of the first gate insulating layer 4a is smaller than the film thickness of a gate insulating film of the second gate insulating layer 4b. Still alternatively, the dielectric constants of materials of the respective gate insulating layers may be changed so that the dielectric constant of the gate insulating film of the first gate insulating layer 4a is higher than the dielectric constant of the gate insulating film of the second gate insulating layer 4b. Yet alternatively, any of the lengths of the gate conductor layers 5a and 5b, and the film thicknesses and dielectric constants of the gate insulating layers 4a and 4b may be combined so that the gate capacitance of the first gate conductor layer 5a connected to the plate line PL is larger than the gate capacitance of the second gate conductor layer 5b connected to the word line WL.

FIGS. 2A to 2C are diagrams explaining an effect of a case where the gate capacitance of the first gate conductor layer 5a connected to the plate line PL is larger than the gate capacitance of the second gate conductor layer 5b connected to the word line WL.

FIG. 2A is a structural diagram schematically illustrating a major portion of the dynamic flash memory cell according to the first embodiment of the present invention. The bit line BL, the word line WL, the plate line PL, and the source line SL are connected to the dynamic flash memory cell. The potential state of the channel region 7 is determined in accordance with the voltage states of these lines.

FIG. 2B is a diagram for explaining the relationship among the respective capacitances. A capacitance $C_{FB}$ of the channel region 7 is the sum total of a capacitance $C_{WL}$ between the channel region 7 and the second gate conductor layer 5b connected to the word line WL, a capacitance $C_{PL}$ between the channel region 7 and the gate conductor layer 5a connected to the plate line PL, a junction capacitance $C_{SL}$ of PN junction between the channel region 7 and the source $N^+$ layer 3a connected to the source line SL, and a junction capacitance $C_{BL}$ of PN junction between the channel region 7 and the drain $N^+$ layer 3b connected to the bit line BL. The sum total is expressed as follows:

$$C_{FB}=C_{WL}+C_{PL}+C_{BL}+C_{SL} \quad (1)$$

Accordingly, a coupling efficiency $\beta_{WL}$ between the word line WL and the channel region 7, a coupling efficiency $\beta_{PL}$ between the plate line PL and the channel region 7, a coupling efficiency $\beta_{BL}$ between the bit line BL and the channel region 7, and a coupling efficiency $\beta_{SL}$ between the source line SL and the channel region 7 are expressed as follows:

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, since $C_{PL}>C_{WL}$, $\beta_{PL}>\beta_{WL}$ is established.

FIG. 2C is a diagram for explaining a change in voltage $V_{FB}$ of the channel region 7 when a voltage $V_{WL}$ of the word line WL rises and then drops as the result of a read operation and a write operation. Here, a potential difference $\Delta V_{FB}$ when the voltage $V_{WL}$ of the word line WL rises from 0 V to a high-voltage state $V_{WLH}$ and when the voltage $V_{FB}$ of the channel region 7 rises from a low-voltage state $V_{FBL}$ to a high-voltage state $V_{FBH}$ is as follows:

$$\Delta V_{FB} = V_{FBH} - V_{FBL} = \beta_{WL} \times V_{WLH} \quad (6)$$

Since the coupling efficiency $\beta_{WF}$ between the word line WL and the channel region 7 is small and the coupling efficiency $\beta_{PL}$ between the plate line PL and the channel region 7 is large, $\Delta V_{FB}$ is small, and even when the voltage $V_{WL}$ of the word line WL rises and drops by a read operation and a write operation, the voltage $V_{FB}$ of the channel region 7 almost does not change.

FIGS. 3AA, 3AB, 3AC, and 3B illustrate a memory write operation (an example of a "memory write operation" in the claims) of the dynamic flash memory cell according to the first embodiment of the present invention. FIG. 3AA illustrates a mechanism of the write operation. FIG. 3AB illustrates operation waveforms of the bit line BL, the source line SL, the plate line PL, the word line WL, and the channel region 7 presented as a floating body FB. At a time T0, the dynamic flash memory cell is in a "0" erase state, and the voltage of the channel region 7 is $V_{FB}$"0". $V_{SS}$ is applied to the bit line BL, the source line SL, and the word line WL. $V_{PLL}$ is applied to the plate line PL. Here, for example, $V_{SS}$ is 0 V, and $V_{PLL}$ is 2 V. Then, when the voltage of the bit line BL rises from $V_{SS}$ to $V_{BLH}$ in a period from a time T1 to a time T2, for example, in the case where $V_{SS}$ is 0 V, the voltage of the channel region 7 becomes $V_{FB}$"0"+$\beta_{BL} \times V_{BLH}$ by capacitive coupling between the bit line BL and the channel region 7.

Subsequently, the write operation of the dynamic flash memory cell is described with reference to FIGS. 3AA and 3AB. In a period from a time T3 to a time T4, the voltage of the word line WL rises from $V_{SS}$ to $V_{WLH}$. Accordingly, when a threshold voltage of "0" erasing of a second N-channel MOS transistor region in which the second gate conductor layer 5b connected to the word line WL surrounds the channel region 7 is $V_{t_{WL}}$"0", the voltage of the channel region 7 becomes $V_{FB}$"0"+$\beta_{BL} \times V_{BLH}+\beta_{WL} \times Vt_{WL}$"0" by second capacitive coupling between the word line WL and the channel region 7 along with a rise in voltage of the word line WL, from $V_{SS}$ to $Vt_{WL}$"0". When the voltage of the word line WL rises to $Vt_{WL}$"0" or more, an annular inversion layer 12b is formed in the channel region 7 on the inner periphery of the second gate conductor layer 5b. The inversion layer 12b interrupts the second capacitive coupling between the word line WL and the channel region 7.

Subsequently, the write operation of the dynamic flash memory cell is described with reference to FIGS. 3AA and 3AB. In the period from the time T3 to the time T4, for example, a fixed voltage of $V_{PLL}$=2 V is input to the first gate conductor layer 5a connected to the plate line PL, and the voltage of the second gate conductor layer 5b connected to the word line WL is raised to, for example, $V_{WLH}$=4 V. Consequently, as illustrated in FIG. 3AA, an annular inversion layer 12a is formed in the channel region 7 on the inner periphery of the first gate conductor layer 5a connected to the plate line PL. A pinch-off point 13 is present in the inversion layer 12a. Consequently, a first N-channel MOS transistor region having the first gate conductor layer 5a operates in a saturation region. In contrast, the second N-channel MOS transistor region having the second gate conductor layer 5b connected to the word line WL operates in a linear region. Consequently, a pinch-off point is not present in the channel region 7 on the inner periphery of the second gate conductor layer 5b connected to the word line WL, but the inversion layer 12b is formed on the whole surface of the inner periphery of the gate conductor layer 5b. The inversion layer 12b formed on the whole surface of the inner periphery of the second gate conductor layer 5b connected to the word line WL works as a substantial drain in the second N-channel MOS transistor region having the second gate conductor layer 5b. Consequently, the field strength becomes the maximum in a first boundary region of the channel region 7 between the first N-channel MOS transistor region having the first gate conductor layer 5a and the second N-channel MOS transistor region having the second gate conductor layer 5b, which are connected in series, and an impact ionization phenomenon occurs in the region. The region is a region on the source side when viewed from the second N-channel MOS transistor region having the second gate conductor layer 5b connected to the word line WL. Hence, the phenomenon is called a source-side impact ionization phenomenon. With the source-side impact ionization phenomenon, electrons flow from the N$^+$ layer 3a connected to the source line SL to the N$^+$ layer 3b connected to the bit line BL. Accelerated electrons collide with lattice Si atoms, and electron-positive hole pairs are generated with the kinetic energy. Some electrons of the generated electrons flow to the first gate conductor layer 5a and the second gate conductor layer 5b. Most electrons of the generated electrons flow to the N$^+$ layer 3b connected to the bit line BL (not illustrated).

Then, as illustrated in FIG. 3AC, a generated positive hole group 9 (an example of a "positive hole group" in the claims) is a majority carrier of the channel region 7, and charges the channel region 7 to a positive bias. Since the voltage of the N$^+$ layer 3a connected to the source line SL is 0 V, the channel region 7 is charged up to a built-in voltage Vb (about 0.7 V) of PN junction between the channel region 7 and the N$^+$ layer 3a connected to the source line SL. When the channel region 7 is charged to have the positive bias, the threshold voltages of the first N-channel MOS transistor region and the second N-channel MOS transistor region are lowered by a substrate bias effect.

Subsequently, the write operation of the dynamic flash memory cell is described with reference to FIG. 3AB. In a period from a time T6 to a time T7, the voltage of the word line WL drops from $V_{WLH}$ to $V_{SS}$. At this time, the word line WL and the channel region 7 have second capacitive coupling. However, the inversion layer 12b interrupts the second capacitive coupling until the voltage $V_{WLH}$ of the word line WL becomes a threshold voltage $Vt_{WL}$"1" or less of the second N-channel MOS transistor region when the voltage of the channel region 7 is Vb. Accordingly, the substantial capacitive coupling between the word line WL and the channel region 7 is provided only when the voltage of the word line WL becomes $Vt_{WL}$"1" or less and drops to $V_{SS}$. Consequently, the voltage of the channel region 7 becomes Vb−$\beta_{WL}$×$Vt_{WL}$"1". Here, $Vt_{WL}$"1" is lower than $Vt_{WL}$"0" described above, and $\beta_{WL}$×$Vt_{WL}$"1" is small.

Subsequently, the write operation of the dynamic flash memory cell is described with reference to FIG. 3AB. In a period from a time T8 to a time T9, the voltage of the bit line BL drops from $V_{BLH}$ to $V_{SS}$. Since the bit line BL and the channel region 7 are capacitively coupled, the "1" write voltage $V_{FB}$"1" of the channel region 7 finally becomes as follows:

$$V_{FB}\text{"1"}=Vb-\beta_{WL}\times Vt_{WL}\text{"1"}-\beta_{BL}\times V_{BLH} \quad (7)$$

Figure 3B:
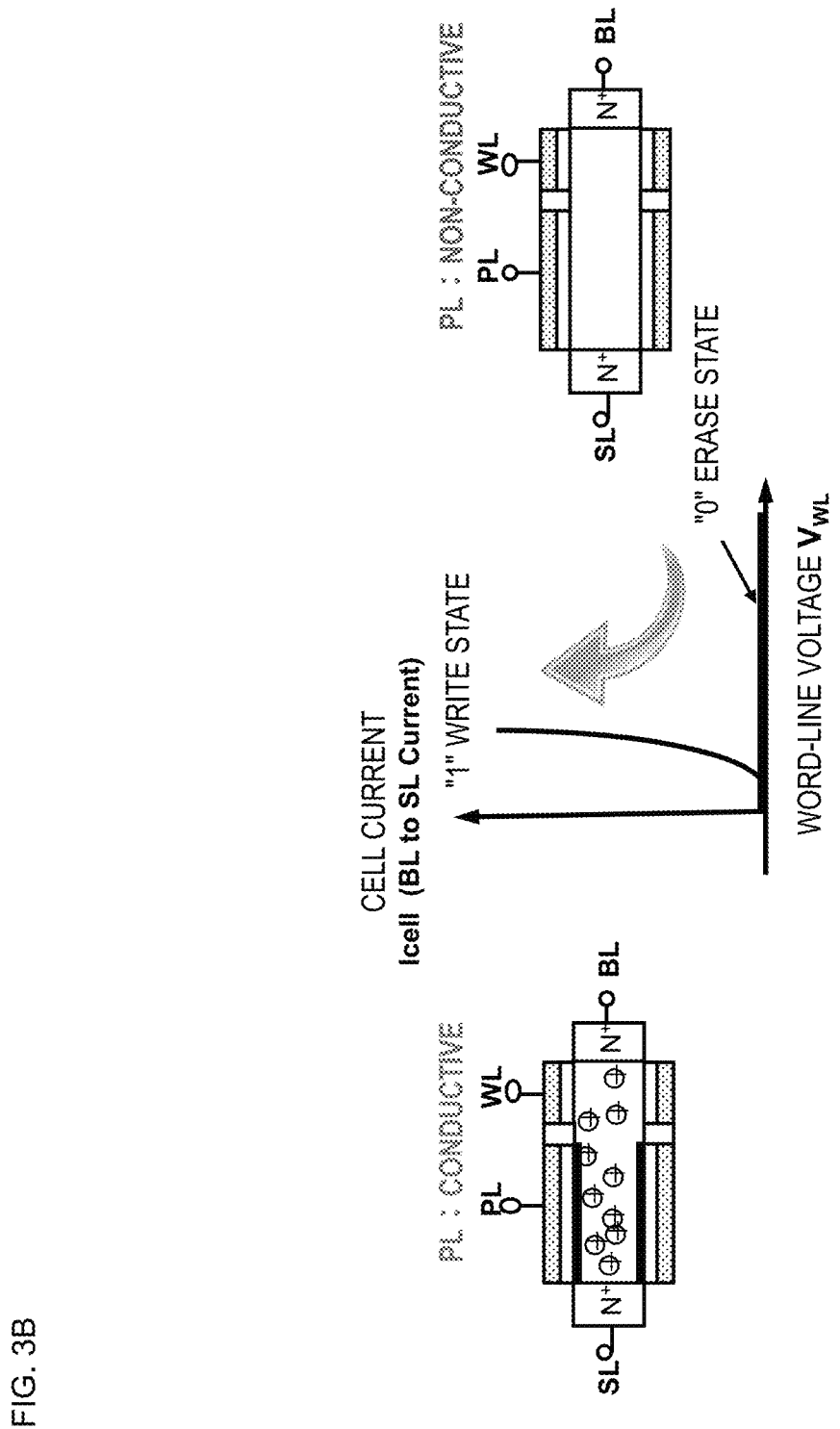
FIG. 3B is a diagram for explaining the write operation mechanism of the memory device having the SGT according to the first embodiment.

Here, the coupling ratio $\beta_{BL}$ between the bit line BL and the channel region 7 is also small. Accordingly, as illustrated in FIG. 3B, the threshold voltage of the second N-channel MOS transistor region of the second channel region 7b connected to the word line WL is lowered. A memory write operation of setting the "1" write state of the channel region 7 to a first data holding voltage (an example of a "first data holding voltage" in the claims) is performed. This state is allocated to logic storage data "1".

Alternatively, instead of the first boundary region, in a second boundary region between the N$^+$ layer 3a and the first channel semiconductor layer 7a or a third boundary region between the N$^+$ layer 3b and the second channel semiconductor layer 7b, electron-positive hole pairs may be generated by the impact ionization phenomenon, and a generated positive hole group 9 may charge the channel region 7 during the write operation.

The conditions of voltages to be applied to the above-described bit line BL, source line SL, word line WL, and plate line PL and the potential of the floating body are merely examples for performing the write operation. Other operational conditions may be employed as long as the write operation can be performed.

A memory erase operation (an example of a "memory erase operation" in the claims) mechanism is described with reference to FIGS. 4A to 4ED.

Figure 4A:
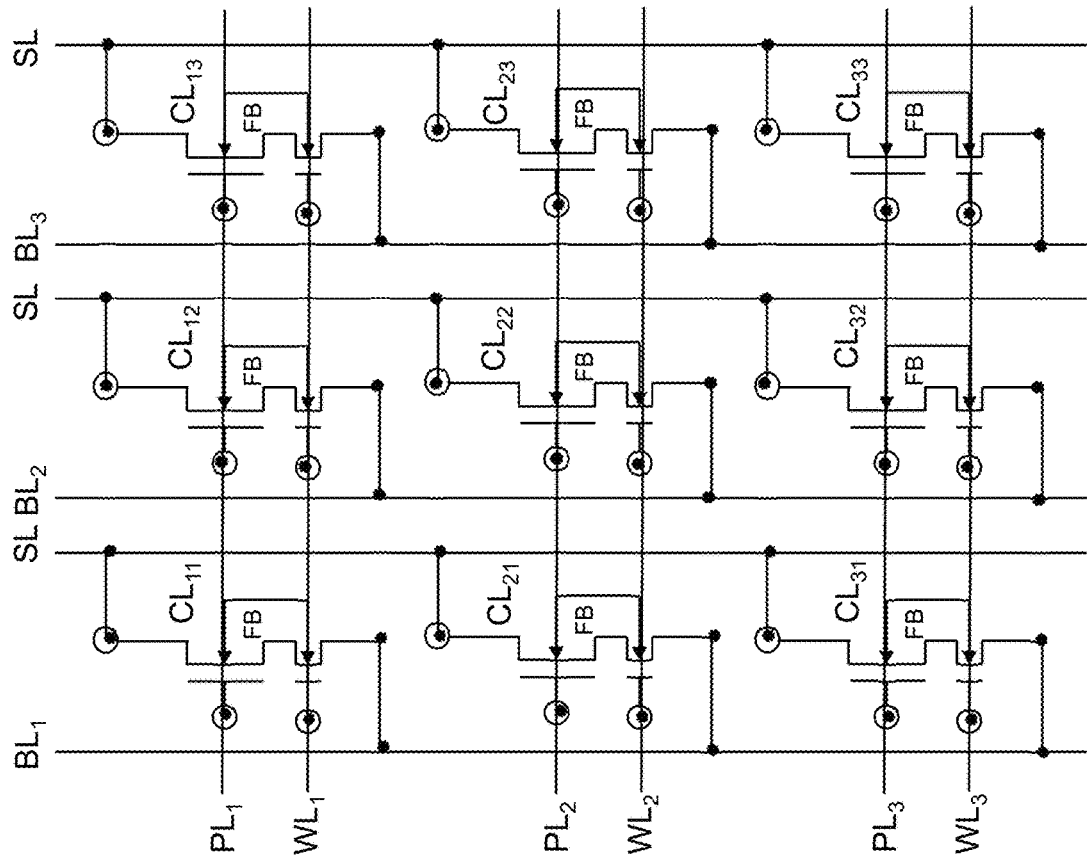
FIG. 4A is a diagram for explaining a page erase operation mechanism of the memory device having the SGT according to the first embodiment.

FIG. 4A is a memory block circuit diagram for explaining a page erase operation. Here, memory cells $CL_{11}$ to $CL_{33}$ in three rows by three columns, which are nine cells in total, are illustrated. However, an actual memory block has more rows and columns than the above-mentioned rows and columns. When memory cells are arranged in rows and columns, one direction of the arrangement is referred to as a "row direction" (or "row form") and a direction perpendicular to the one direction is referred to as "column direction" (or "column form"). A source line SL, one of bit lines $BL_1$ to $BL_3$, one of plate lines $PL_1$ to $PL_3$, and one of word lines $WL_1$ to $WL_3$ are connected to each memory cell. For example, in this block, it is expected that the memory cells $CL_{21}$ to $CL_{23}$ connected to the plate lines $PL_2$ and the word line $WL_2$ of a certain page (an example of a "page" in the claims) are selected and the page erase operation is performed on the selected page.

The mechanism of the page erase operation is described with reference to FIGS. 4BA to 4BD, and 4C. Here, the channel region 7 between the N$^+$ layers 3a and 3b is electrically isolated from the substrate and hence serves as a floating body. FIG. 4BA is a timing operation waveform chart of major nodes of the erase operation. In FIG. 4BA, a time T0 to a time T12 represent times from the start to end of the erase operation. FIG. 4BB illustrates a state in which a positive hole group 9 generated by the impact ionization in the previous cycle is charged in the channel region 7 at the time T0 before the erase operation. Then, in a period from the time T1 to the time T2, the voltages of the bit lines $BL_1$ to $BL_3$ and the source line SL change from $V_{SS}$ to high-voltage states of $V_{BLH}$ and $V_{SLH}$. Here, $V_{SS}$ is, for example, 0 V. With this operation, in the next period from the time T3 to the time T4, the voltages of the plate line $PL_2$ and the word line $WL_2$ selected by the page erase operation change from a first voltage $V_{PLL}$ to a second voltage $V_{PLH}$ in a high-voltage state and from a third voltage $V_{SS}$ to a fourth voltage $V_{WLH}$ in a high-voltage state, respectively. The inversion layer 12a on the inner periphery of the first gate conductor layer 5a connected to the plate line $PL_2$, and the inversion layer 12b on the inner periphery of the second gate conductor layer 5b connected to the word line $WL_2$ are not formed in the channel region 7. Accordingly, when the threshold voltage of the second N-channel MOS transistor region on the word line $WL_2$ side and the threshold voltage of the first N-channel MOS transistor region on the plate line $PL_2$ side are $Vt_{WL}$ and $Vt_{PL}$, respectively, the voltages of $V_{BLH}$ and $V_{SLH}$ desirably satisfy $V_{BLH}>V_{WLH}+Vt_{WL}$, and $V_{SLH}>V_{PLH}+Vt_{PL}$. For example, when $Vt_{WL}$ and $Vt_{PL}$ are 0.5 V, $V_{WLH}$ and $V_{PLH}$ may be set to 3 V, and $V_{BLH}$ and $V_{SLH}$ may be set to 3.5 V or more.

Subsequently, the page erase operation mechanism in FIG. 4BA is described. In a first period from the time T3 to the time T4, along with that the plate line $PL_2$ and the word line $WL_2$ become the high-voltage states of the second voltage $V_{PLH}$ and the fourth voltage $V_{WLH}$, the voltage of the channel region 7 in a floating state is boosted by first capacitive coupling between the plate line $PL_2$ and the channel region 7 and second capacitive coupling between the word line $WL_2$ and the channel region 7. The voltage of the channel region 7 becomes a high voltage from $V_{FB}$"1"

in the "1" write state. This is because the voltages of the bit lines $BL_1$ to $BL_3$ and the source line SL are high voltages such as $V_{BLH}$ and $V_{SLH}$, and the PN junction between the source line N+ layer 3a and the channel region 7 and the PN junction between the drain N+ layer 3b and the channel region 7 are in reverse bias states. Thus, the voltage of the channel region 7 can be boosted.

Subsequently, the page erase operation mechanism in FIG. 4BA is described. In the next period from the time T5 to the time T6, the voltages of the bit lines $BL_1$ to $BL_3$ and the source line SL are lowered from $V_{BLH}$ and $V_{SLH}$, which are the high voltages, to $V_{SS}$. Consequently, as illustrated in FIG. 4BC, the PN junction between the source N+ layer 3a and the channel region 7 and the PN junction between the drain N+ layer 3b and the channel region 7 become forward bias states. Remaining positive hole groups among the positive hole groups 9 in the channel region 7 are discharged to the source N+ layer 3a and the drain N+ layer 3b. Consequently, the voltage $V_{FB}$ of the channel region 7 becomes the built-in voltage Vb of the PN junction formed by the source N+ layer 3a and the channel region 7 of the P layer and the PN junction formed by the drain N+ layer 3b and the channel region 7 of the P layer.

Subsequently, the page erase operation mechanism in FIG. 4BA is described. Next, in a period from the time T7 to the time T8, the voltages of the bit lines $BL_1$ to $BL_3$ and the source line SL rise from $V_{SS}$ to $V_{BLH}$ and $V_{SLH}$ which are the high voltages. With the measure, as illustrated in FIG. 4BD, in a period from the time T9 to the time T10, when the voltages of the plate line $PL_2$ and the word line $WL_2$ drop from the second voltage $V_{PLH}$ and the fourth voltage $V_{WLH}$ to the first voltage $V_{PLL}$ and the third voltage $V_{SS}$, respectively, the voltage $V_{FB}$ of the channel region 7 changes from Vb to $V_{FB}$"0" efficiently by the first capacitive coupling between the plate line $PL_2$ and the channel region 7 and the second capacitive coupling between the word line $WL_2$ and the channel region 7, without forming the inversion layer 12a on the plate line $PL_2$ side and the inversion layer 12b on the word line $WL_2$ side in the channel region 7. Thus, the voltage difference $\Delta V_{FB}$ of the channel region 7 between the "1" write state and the "0" erase state is expressed as follows:

$$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"} = \quad (9)$$

$$\beta_{WL} \times V_{WLH} + \beta_{PL} \times (V_{PLH} - V_{PLL}) - \beta_{WL} \times Vt_{WL}\text{"1"} - \beta_{BL} \times V_{BLH}$$

Here, the sum of $\beta_{WL}$ and $\beta_{PL}$ is 0.8 or more. $\Delta V_{FB}$ becomes large and a sufficient margin is obtained.

Figure 4C:
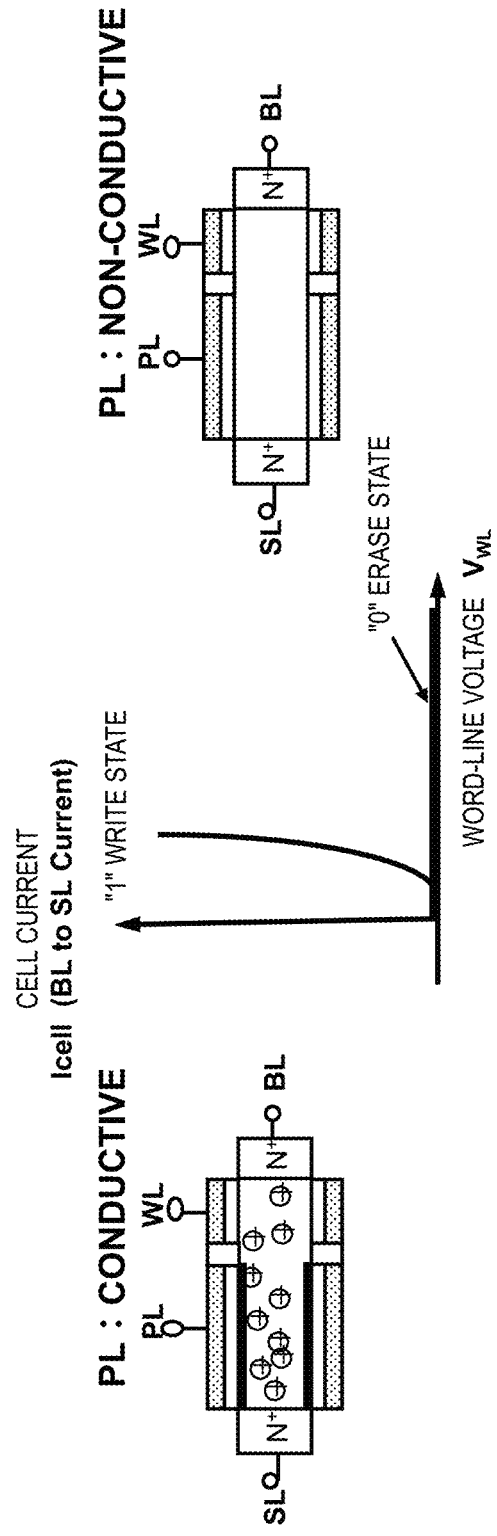
FIG. 4C is a diagram for explaining the page erase operation mechanism of the memory device having the SGT according to the first embodiment.

Consequently, as illustrated in FIG. 4C, a margin is largely obtained between the "1" write state and the "0" erase state. Here, in the "0" erase state, the threshold voltage on the plate line $PL_2$ side is increased by a substrate bias effect. Accordingly, when the application voltage to the plate line $PL_2$ is set to, for example, the threshold voltage or less, the first N-channel MOS transistor region on the plate line $PL_2$ side becomes non-conductive and does not flow memory cell current. "PL: non-conductive" on the right side of FIG. 4C indicates the state.

Subsequently, the page erase operation mechanism in FIG. 4BA is described. Next, in a fourth period from the time T11 to the time T12, the voltage of the bit lines $BL_1$ to $BL_3$ drop from $V_{BLH}$ to $V_{SS}$, the voltage of the source line SL drops from $V_{SLH}$ to $V_{SS}$, and the erase operation is ended. At this time, the bit lines $BL_1$ to $BL_3$ and the source line SL slightly lower the voltage of the channel region 7 by the capacitive coupling. However, the lowered amount is equivalent to the increased amount by which the bit lines $BL_1$ to $BL_3$ and the source line SL increase the voltage of the channel region 7 by the capacitive coupling in the period from the time T7 to the time T8. Consequently, the increased amount and the lowered amount of the voltages of the bit lines $BL_1$ to $BL_3$ and the source line SL are cancelled out and consequently do not affect the voltage of the channel region 7. The page erase operation of setting the voltage $V_{FB}$"0" in the "0" erase state of the channel region 7 to a second data holding voltage (an example of a "second data holding voltage" in the claims) is performed. This state is allocated to logic storage data "0". During data reading after the erase operation, the voltage to be applied to the first gate conductor layer 5a connected to the plate line PL is set to be higher than the threshold voltage at the time of the logic storage data "1" and to be lower than the threshold voltage at the time of the logic storage data "0", thereby obtaining a characteristic that no current flows even when the voltage of the word line WL is increased as illustrated in FIG. 4C.

Next, a mechanism of a page erase operation is described with reference to FIGS. 4DA to 4DD. Differences between FIGS. 4DA to 4DD and FIGS. 4BA to 4BD are that the voltage of the bit lines $BL_1$ to $BL_3$ is $V_{SS}$ or in a floating state, and the voltage of the word line $WL_2$ is fixed to $V_{SS}$ during the page erase operation. Accordingly, in the period from the time T1 to the time T2, even when the voltage of the source line SL is increased from $V_{SS}$ to $V_{SLH}$, the second N-channel MOS transistor region of the word line $WL_2$ is non-conductive and hence memory cell current does not flow. Thus, generation of the positive hole group 9 by the impact ionization phenomenon does not occur. Also, similarly to FIG. 4BA, the voltage of the source line SL oscillates between $V_{SS}$ and $V_{SLH}$ and the voltage of the plate line $PL_2$ oscillates between $V_{PLL}$ and $V_{PLH}$. Consequently, as illustrated in FIG. 4DC, the positive hole group 9 is discharged to the N+ layer 3a of the source line SL.

Next, a mechanism of a page erase operation is described with reference to FIGS. 4EA to 4ED. Differences between FIGS. 4EA to 4ED and FIGS. 4BA to 4BD are that the voltage of the source line SL is $V_{SS}$ or in a floating state, and the voltage of the plate line $PL_2$ is fixed to $V_{SS}$ during the page erase operation. Accordingly, in the period from the time T1 to the time T2, even when the voltage of the bit lines $BL_1$ to $BL_3$ is increased from $V_{SS}$ to $V_{BLH}$, the first N-channel MOS transistor region of the plate line $PL_2$ is non-conductive and hence memory cell current does not flow. Thus, generation of the positive hole group 9 by the impact ionization phenomenon does not occur. Also, similarly to FIG. 4BA, the voltage of the bit lines $BL_1$ to $BL_3$ oscillates between $V_{SS}$ and $V_{BLH}$ and the voltage of the word line $WL_2$ oscillates between $V_{SS}$ and $V_{WLH}$. Consequently, as illustrated in FIG. 4EC, the positive hole group 9 is discharged to the N+ layer 3b of each of the bit lines $BL_1$ to $BL_3$.

The conditions of voltages to be applied to the above-described bit line BL, source line SL, word line WL, and plate line PL and the potential of the floating body are merely examples for performing the page erase operation. Other operational conditions may be employed as long as the page erase operation can be performed.

FIGS. 5A to 5C are diagrams for explaining a read operation of the dynamic flash memory cell according to the first embodiment of the present invention. As illustrated in FIG. 5A, when the channel region 7 is charged to have the built-in voltage Vb (about 0.7 V), the threshold voltage of the second N-channel MOS transistor region having the second gate conductor layer 5b connected to the word line WL is lowered by the substrate bias effect. This state is allocated to the logic storage data "1". As illustrated in FIG. 5B, the memory block selected before writing is performed is in the erase state "0" in advance, and the voltage $V_{FB}$ of the channel region 7 is $V_{FB}$"0". The write operation randomly stores the write state "1". Consequently, logic storage data of a logic "0" and a logic "1" are created for the word line WL. As illustrated in FIG. 5C, reading is performed with a sense amplifier using a difference between high and low of the two threshold voltages for the word line WL. During data reading of the logic "0", the voltage to be applied to the first gate conductor layer 5a connected to the plate line PL is set to be higher than the threshold voltage at the time of the logic storage data "1", and to be lower than the threshold voltage at the time of the logic storage data "0", thereby obtaining a characteristic that no current flows even when the voltage of the word line WL is increased as illustrated in FIG. 5C.

The conditions of voltages to be applied to the above-described bit line BL, source line SL, word line WL, and plate line PL and the potential of the floating body are merely examples for performing the read operation. Other operational conditions may be employed as long as the read operation can be performed.

Performance of a refresh operation (an example of a "refresh operation" in the claims) before a page read operation (an example of a "page read operation" in the claims) of the dynamic flash memory cell according to the first embodiment of the present invention is described with reference to FIGS. 6A to 6M.

Figure 6A:
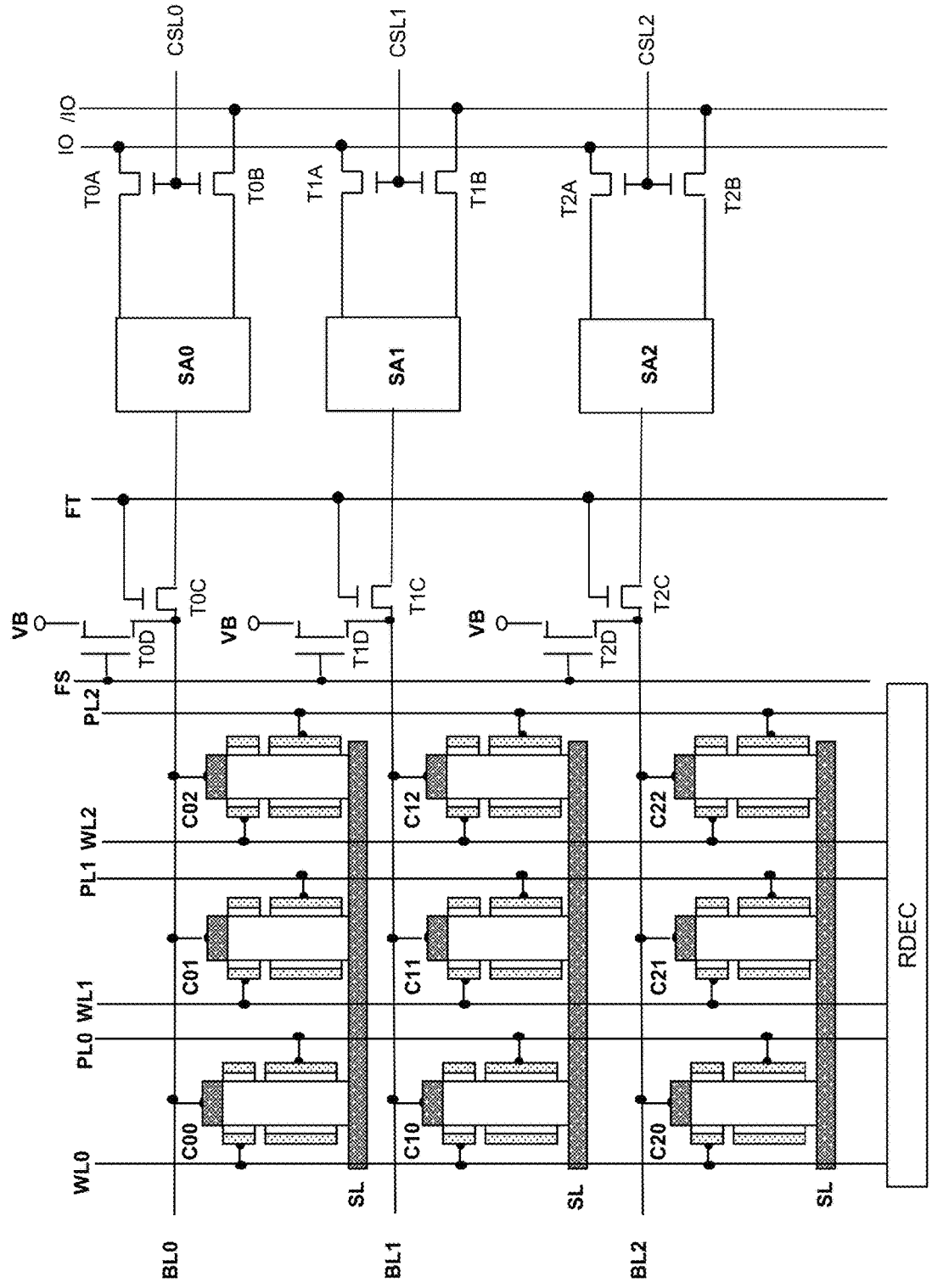
FIG. 6A is a circuit block diagram for explaining a refresh operation before a page read operation of the memory device having the SGT according to the first embodiment.

In FIG. 6A, memory cells C00 to C22 arranged in three rows by three columns constitute a portion of a memory cell block (an example of a "memory cell block" in the claims). Here, the memory cells C00 to C22 arranged in three rows by three columns are illustrated; however, memory cells arranged in rows and columns more than three rows by three columns constitute an actual memory cell block. One of word lines WL0 to WL2, one of plate lines PL0 to PL2, a source line SL, and one of bit lines BL0 to BL2 are connected to each memory cell. Transistors T0C to T2C whose gates receive a transfer signal FT each constitute a switch circuit. Drains of transistors T0D to T2D whose gates are connected to a bit-line pre-charge signal FS are connected to a bit-line power supply VB, and sources thereof are connected to the respective bit lines BL0 to BL2. The respective bit lines BL0 to BL2 are connected to sense amplifier circuits (an example of a "sense amplifier circuit" in the claims) SA0 to SA2 via the switch circuits. The word lines WL0 to WL2 and the plate lines PL0 to PL2 are connected to a row decoder circuit (an example of a "row decoder circuit" in the claims) RDEC. The sense amplifier circuits SA0 to SA2 are connected to a pair of input/output lines IO and/IO via transistors T0A to T2B whose gates are connected to column select lines CSL0 to CSL2.

Figure 6B:
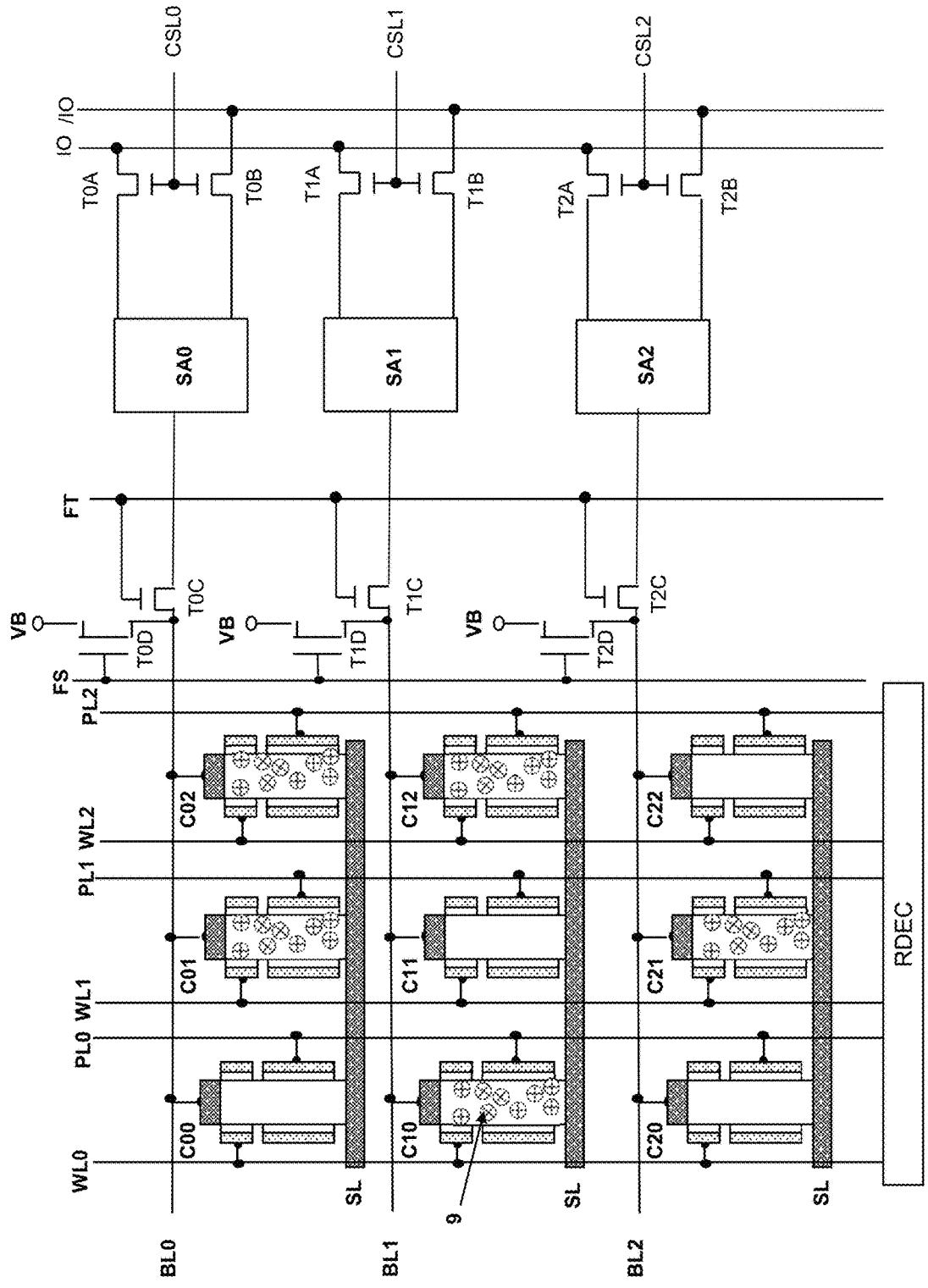
FIG. 6B is a circuit block diagram for explaining the refresh operation before the page read operation of the memory device having the SGT according to the first embodiment.
Figure 6C:
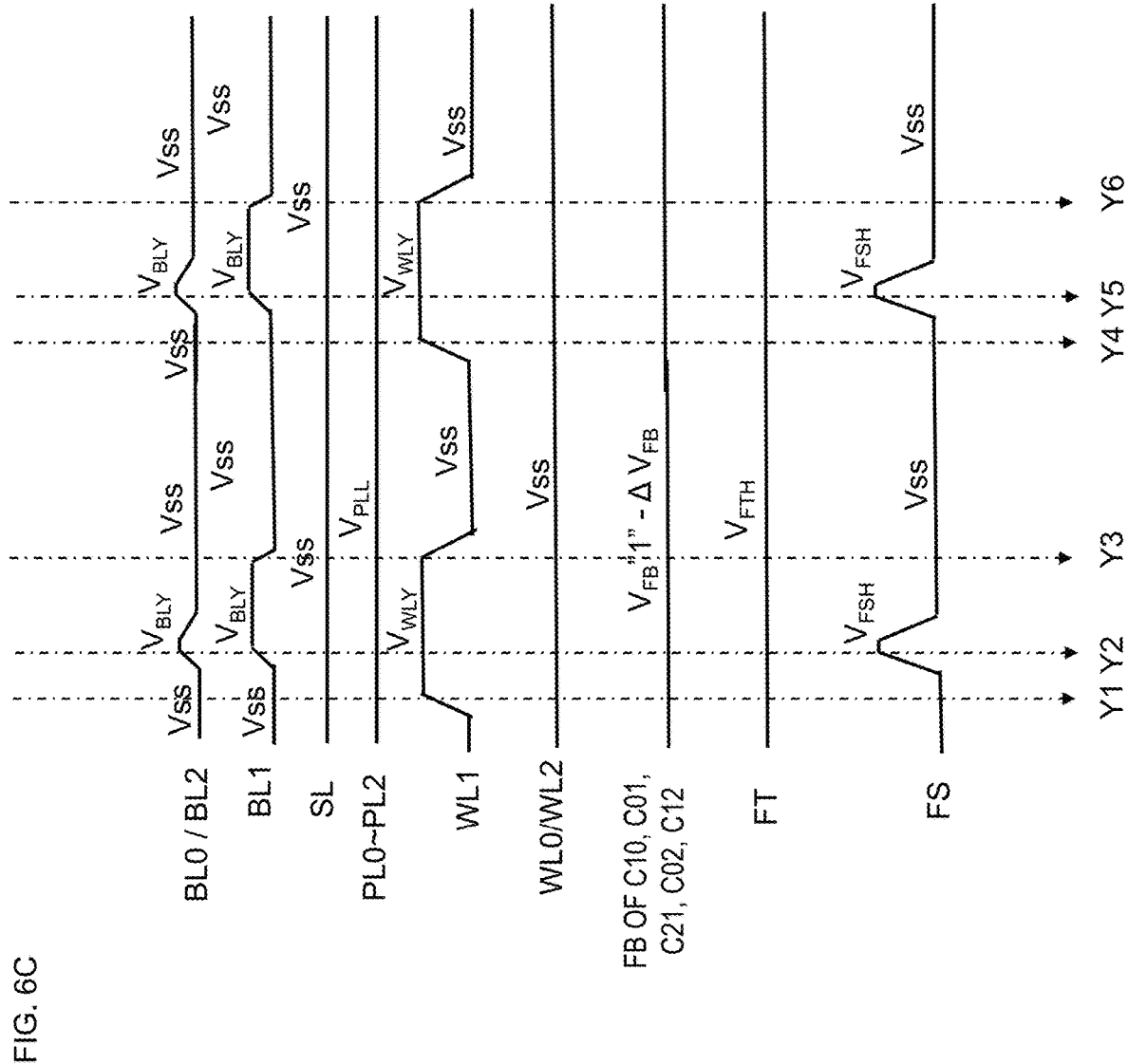
FIG. 6C is an operation waveform chart for explaining the refresh operation before the page read operation of the memory device having the SGT according to the first embodiment.

FIG. 6B indicates a circuit block diagram in which "1" writing is randomly performed in the memory cells C10, C01, C21, C02, and C12 among the memory cells C00 to C22 at a certain timing, and positive hole groups 9 are accumulated in channel regions 7 of the memory cells C10, C01, C21, C02, and C12. FIG. 6C indicates an operation waveform chart for reading the memory cells in FIG. 6B. In a period from a time Y1 to a time Y3, page data (an example of "page data" in the claims) stored in a first memory cell group C01, C11, C21 (an example of a "memory cell group" in the claims) belonging to a first page is read to the sense amplifier circuits SA0 to SA2. At the time Y1, the voltage of the word line WL1 connected to the first memory cell group C01, C11, C21 rises from a low voltage $V_{SS}$ to a high voltage $V_{WLY}$ for reading. At the time Y2, the voltage of the bit lines BL0 to BL2 rises from a low voltage $V_{SS}$ to a high voltage $V_{BLY}$ for reading. Here, $V_{SS}$ may be, for example, a ground voltage $V_{SS}$=0 V. At the time Y3, the voltage of the word line WL1 drops from the high voltage $V_{WLY}$ for reading to the low voltage $V_{SS}$. A period from a time Y4 to a time Y6 in FIG. 6C indicates an operation waveform chart for repeatedly reading storage data of the first memory cell group C01, C11, C21 selected with the word line WL1 similarly to the period from the time Y1 to the time Y3.

FIGS. 6D to 6I indicate cycles C1 to C6 in which the storage data of the first memory cell group C01, C11, C21 selected with the word line WL1 is repeatedly read six times. Here, FIGS. 6D and 6E indicate a case where a voltage $V_{BLY1}$ of the bit lines BL0 to BL2 for reading is high, FIGS. 6F and 6G indicate a case where a voltage $V_{BLY2}$ of the bit lines BL0 to BL2 for reading is intermediate, and FIGS. 6H and 6I indicate a case where a voltage $V_{BLY3}$ of the bit lines BL0 to BL2 for reading is low. Here, an application voltage VB to the bit lines BL0 to BL2 is input from drains of the MOS transistors T0D to T2D in FIGS. 6E, 6G, and 6I. For example, the voltage $V_{BLY1}$ of the bit lines BL0 to BL2 is about 0.8 V, the voltage $V_{BLY2}$ of the bit lines BL0 to BL2 is about 0.6 V, and the voltage $V_{BLY3}$ of the bit lines BL0 to BL2 is about 0.2 V.

Figure 6D:
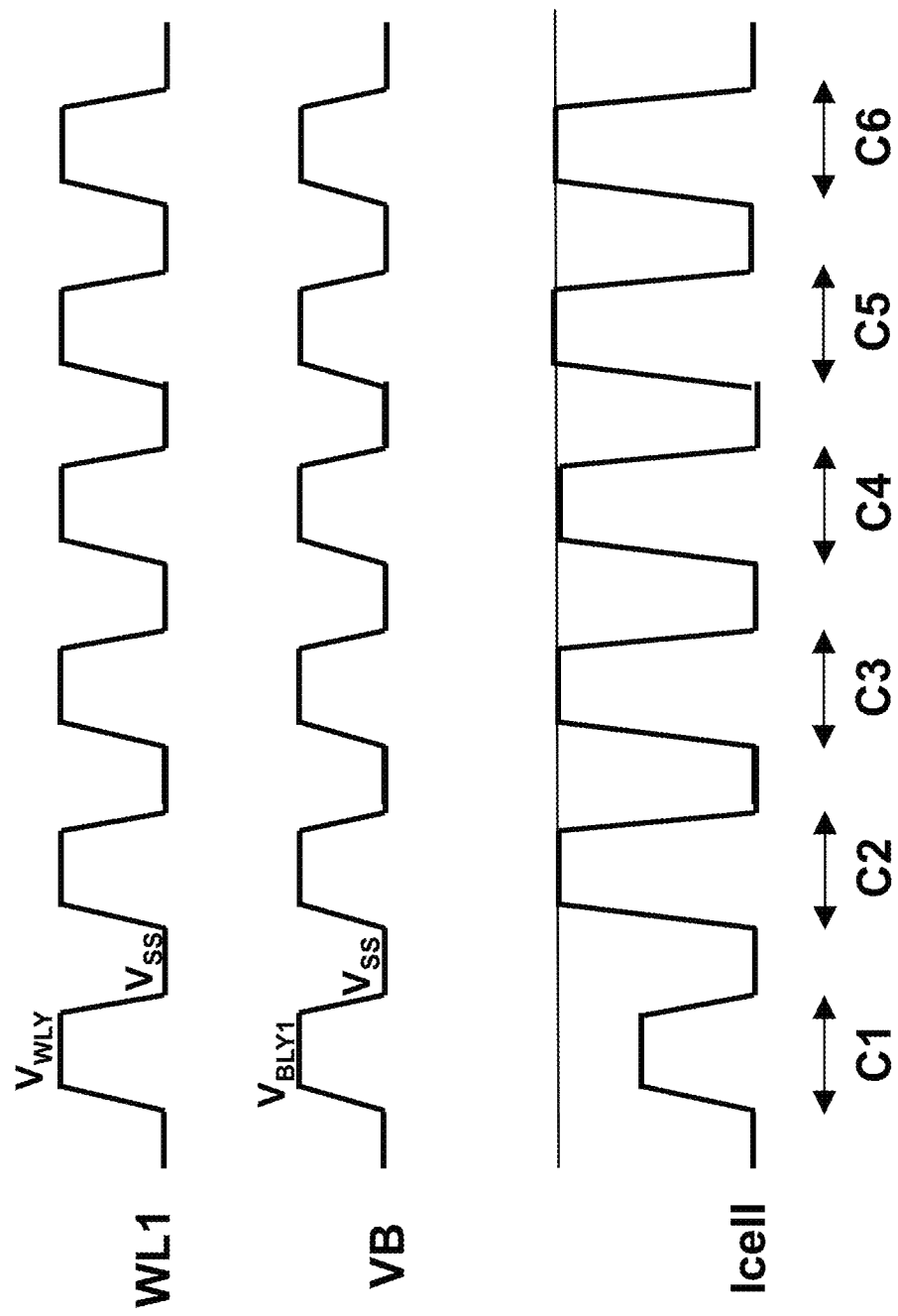
FIG. 6D is an operation waveform chart for explaining the refresh operation before the page read operation of the memory device having the SGT according to the first embodiment.
Figure 6E:
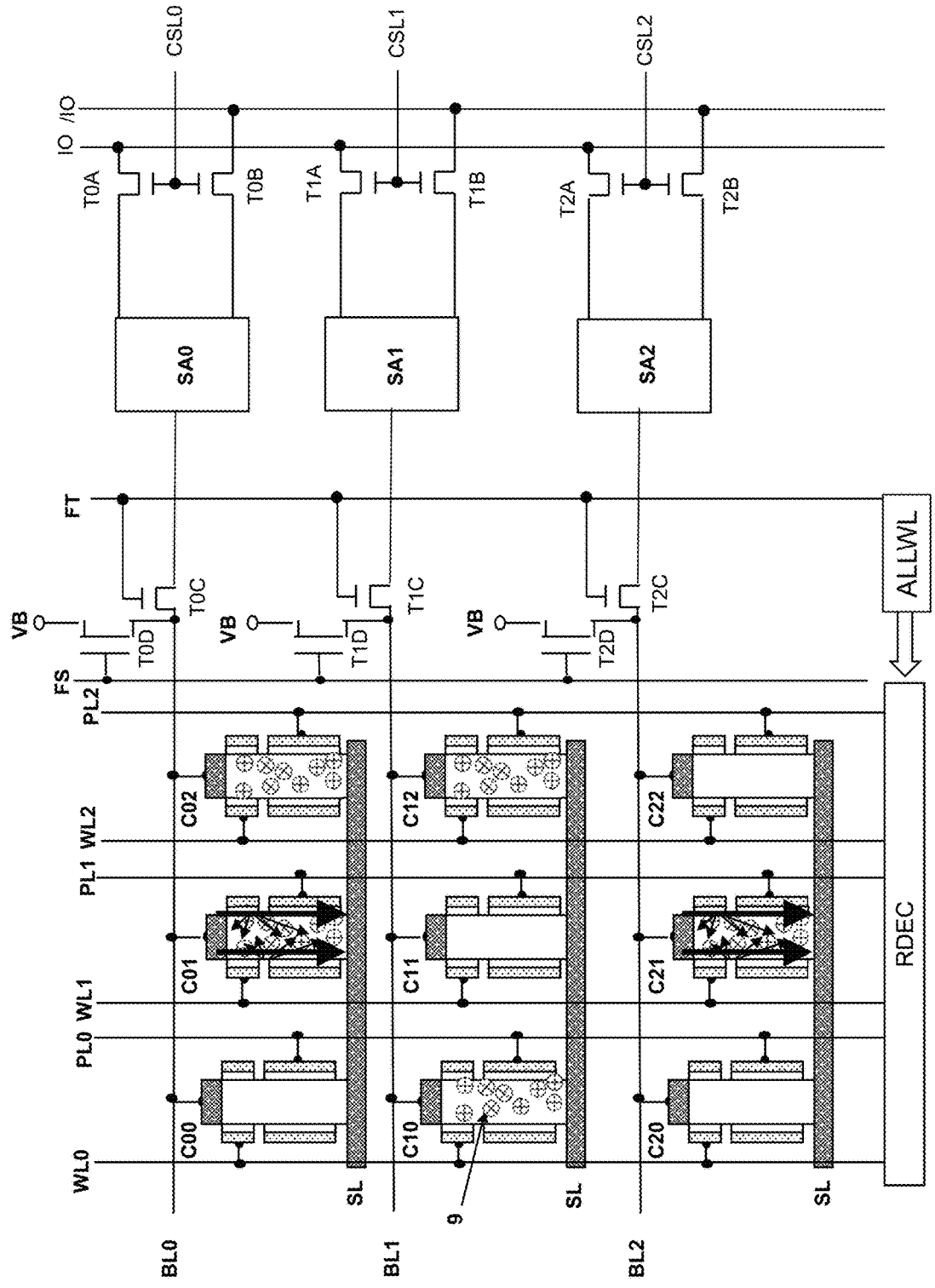
FIG. 6E is a circuit block diagram for explaining the refresh operation before the page read operation of the memory device having the SGT according to the first embodiment.

When the voltage $V_{BLY1}$ of the bit lines BL0 to BL2 for reading indicated in FIGS. 6D and 6E is high, positive holes are noticeably generated by a source-side impact ionization phenomenon in parallel to reading. Consequently, the number of positive holes lost at "1" writing and later, or the number of positive holes discharged by the capacitive coupling with the channel region 7 by reset of the word line WL, the plate line PL, and the bit line BL immediately after "1" writing returns to the number of positive holes in the "1" write state in the first read cycle C1. Thus, the refresh operation is performed in parallel to the page read operation. Consequently, memory cell current Icell increases, and is saturated in the second read cycle C2 and later. In FIG. 6G, the memory cell current Icell is current flowing from the bit line BL to the source line SL and is indicated by downward arrows.

Figure 6F:
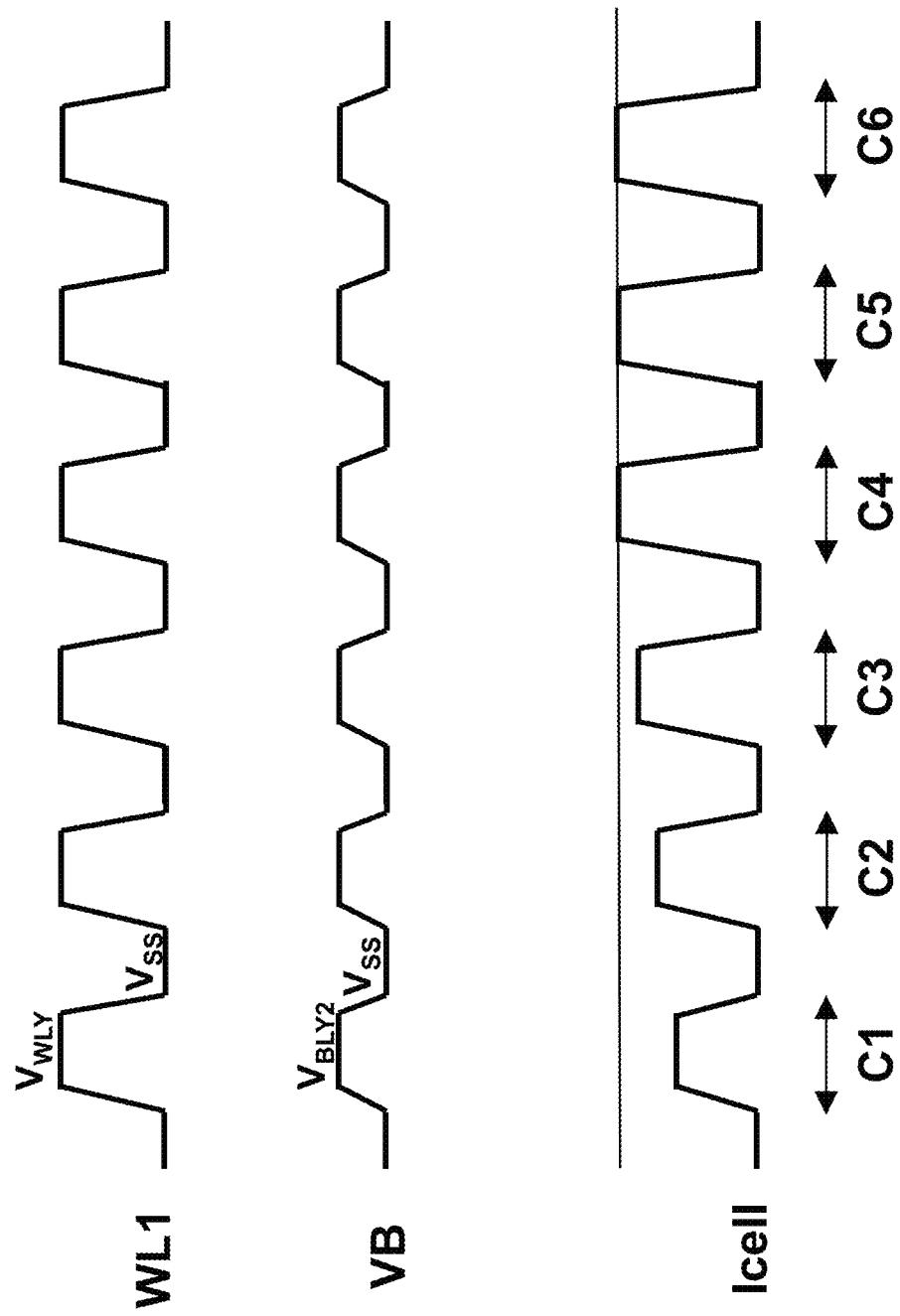
FIG. 6F is an operation waveform chart for explaining the refresh operation before the page read operation of the memory device having the SGT according to the first embodiment.
Figure 6G:
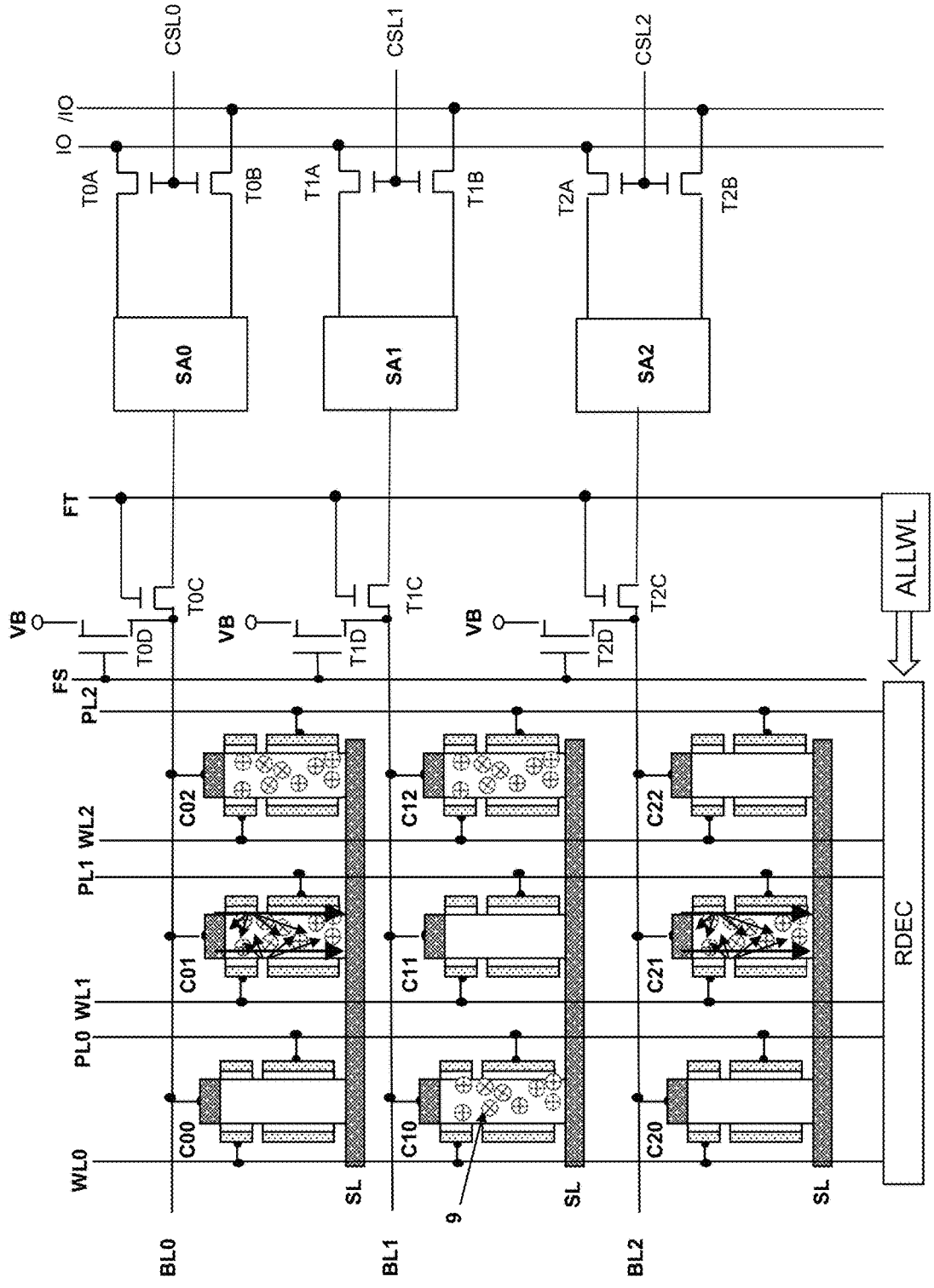
FIG. 6G is a circuit block diagram for explaining the refresh operation before the page read operation of the memory device having the SGT according to the first embodiment.

When the voltage $V_{BLY2}$ of the bit lines BL0 to BL2 for reading indicated in FIGS. 6F and 6G is intermediate, generation of positive holes by the source-side impact ionization phenomenon occurs in parallel to reading. However, the generation of positive holes is not noticeable compared to the case where the voltage $V_{BLY1}$ of the bit lines BL0 to BL2 indicated in FIGS. 6D and 6E is high. Consequently, the memory cell current Icell increases as reading is repeated; however, the memory cell current Icell is saturated in the fourth read cycle C4 and later.

Figure 6H:
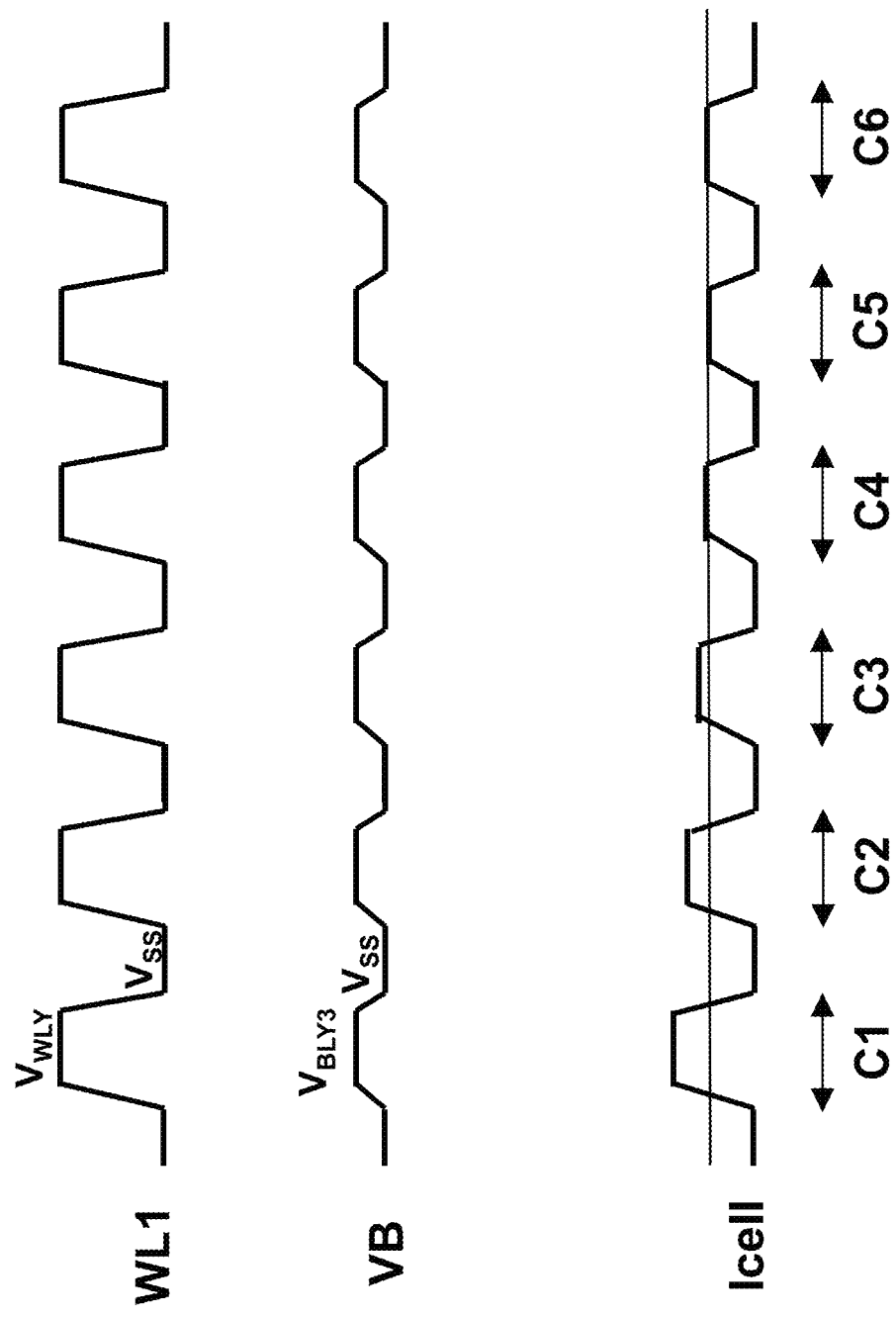
FIG. 6H is an operation waveform chart for explaining the refresh operation before the page read operation of the memory device having the SGT according to the first embodiment.
Figure 6I:
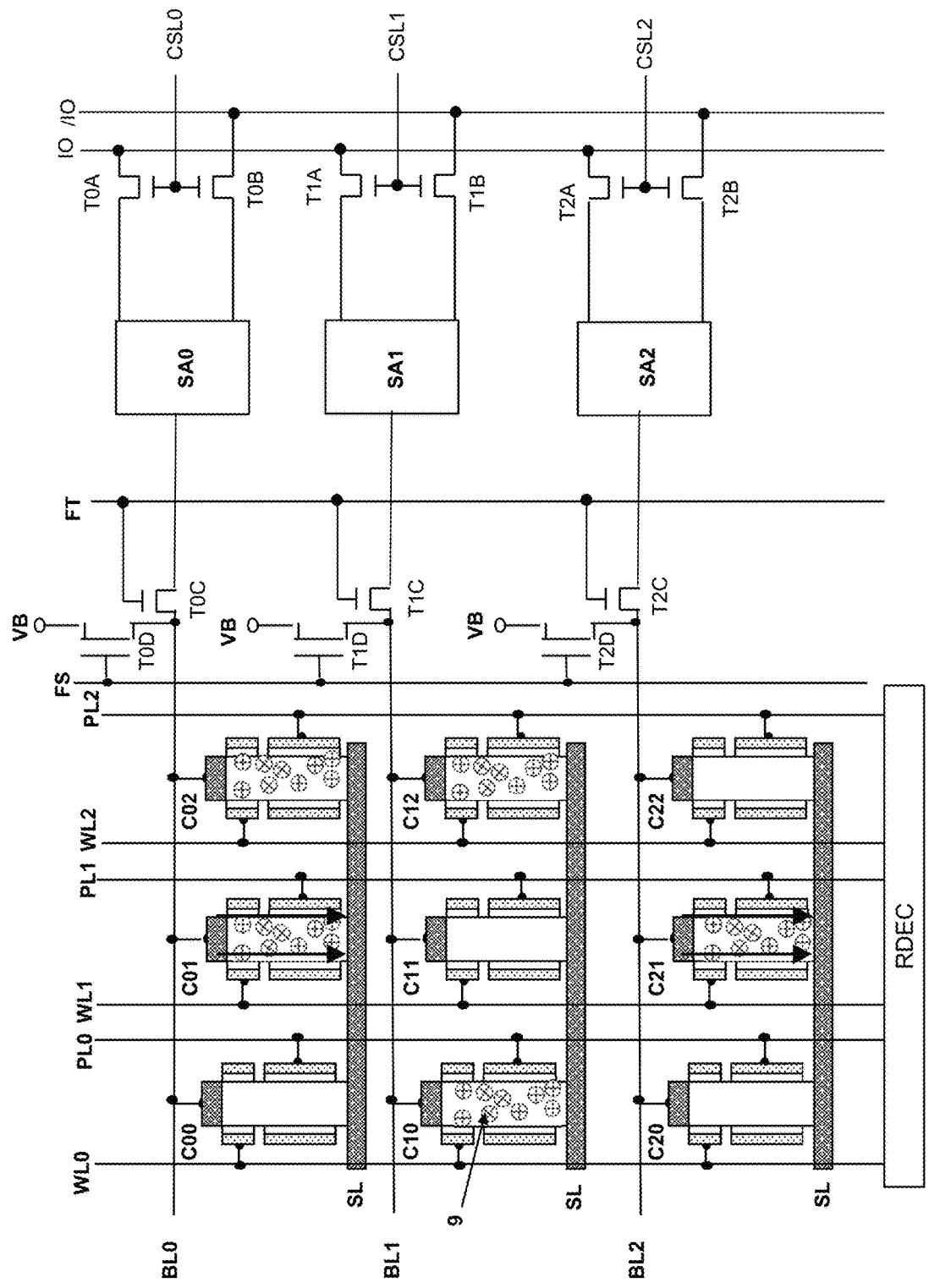
FIG. 6I is a circuit block diagram for explaining the refresh operation before the page read operation of the memory device having the SGT according to the first embodiment.

When the voltage $V_{BLY3}$ of the bit lines BL0 to BL2 for reading indicated in FIGS. 6H and 6I is further low, generation of positive holes by the source-side impact ionization phenomenon does not occur in parallel to reading. Consequently, positive holes are discharged and "1" write data is lost by the capacitive coupling with the channel region 7 by reset of the word line WL and the bit line BL that oscillate every reading.

During reading, by setting the bit-line voltage to, for example, 0.5 V or more and reading the memory cell, positive holes are supplied simultaneously with reading.

That is, a complete read non-destructive memory can be provided. Also, when positive holes are generated by repeating the reading, the threshold voltages of the first gate conductor layer 5a and the second gate conductor layer 5b that receive inputs of the plate line PL and the word line WL decrease. That is, a positive feedback is applied for generation of positive holes. The positive feedback depends on the voltage VB of the bit line BL. As the voltage VB is higher, the positive feedback is more noticeable. Also, the discharge of positive holes by reading and the generation of positive holes by the impact ionization phenomenon with read current Icell are balanced and saturated as reading is repeated.

By increasing the bit-line voltage to 0.5 V or more during normal page reading, erroneous reading does not occur even at first reading in C1. However, regarding the speed of page reading and a more stable read operation, the first read operation in C1 desirably serves as a refresh operation before the first page read operation in C1 is performed.

Figure 6J:
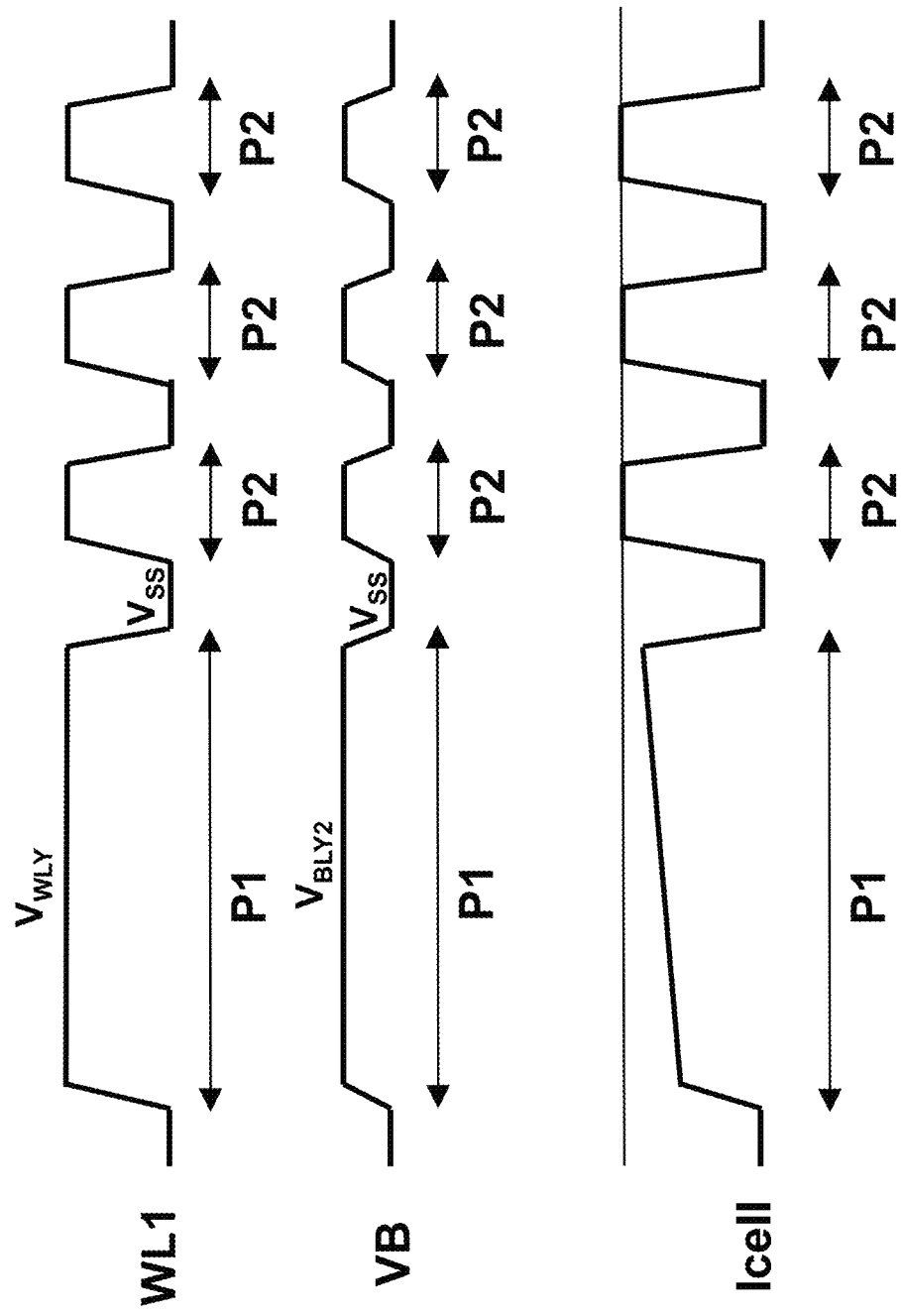
FIG. 6J is an operation waveform chart for explaining the refresh operation before the page read operation of the memory device having the SGT according to the first embodiment.

FIG. 6J indicates an example in which a first pulse width (an example of a "first pulse width" in the claims) P1 of the voltage VB of the word line WL and the bit line BL during the refresh operation is larger than a second pulse width (an example of a "second pulse width" in the claims) P2 during the page read operation. Since the pulse width during the refresh operation is large, even with the bit line indicated in FIG. 6F has the intermediate voltage $V_{BLY2}$, the one-time refresh operation before the page read operation causes the memory cell Icell to be saturated and stable.

Figure 6K:
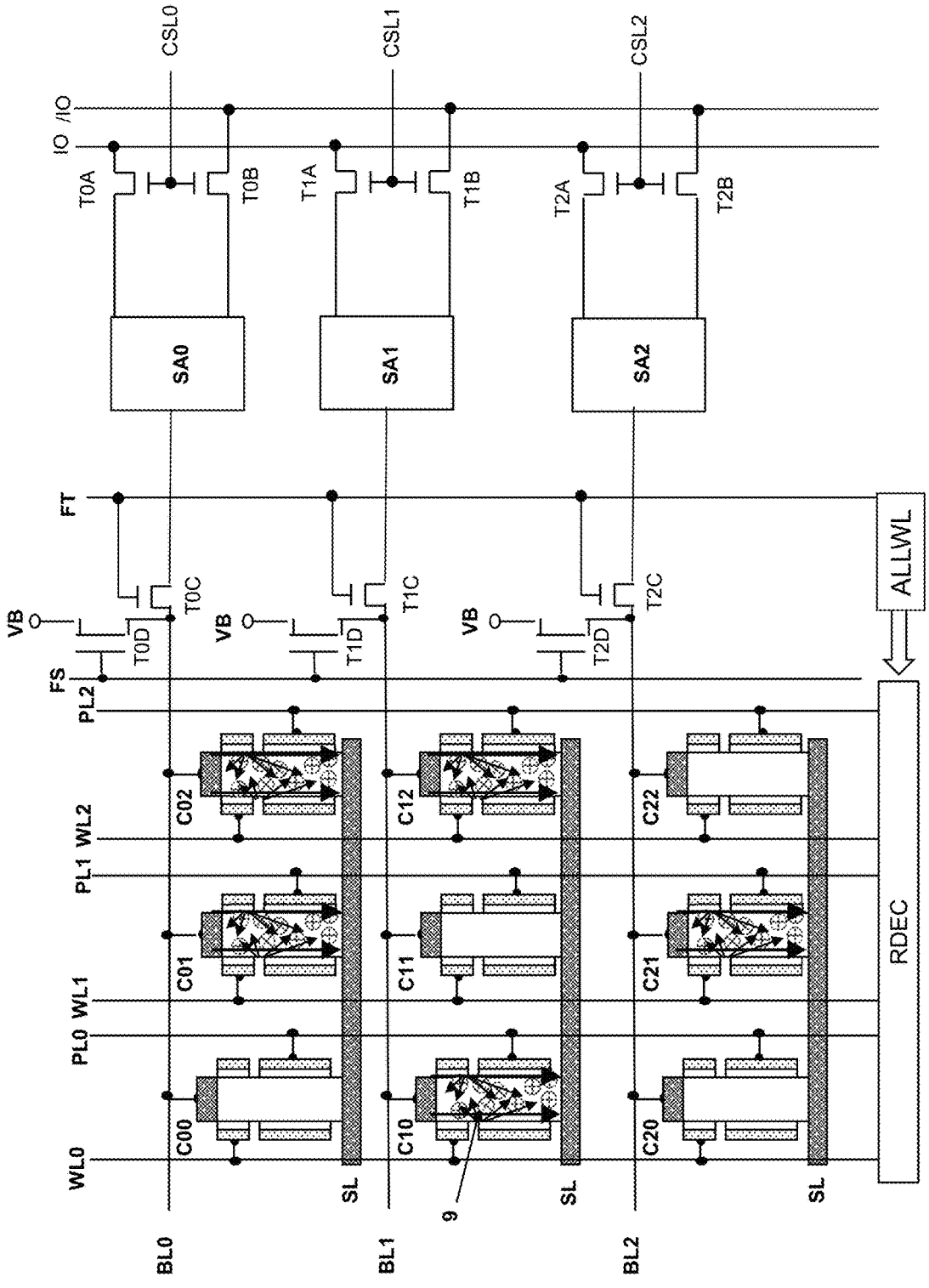
FIG. 6K is a circuit block diagram for explaining the refresh operation before the page read operation of the memory device having the SGT according to the first embodiment.

Referring to FIG. 6K, the refresh operation relating to all word lines WL in the memory cell block is described. FIG. 6K indicates a case where a word-line all select signal (an example of a "word-line all select signal" in the claims) ALLWL is input to the row decoder circuit. Here, a state is indicated in which all the word lines WL0 to WL2 in the memory cell block are selected, and the memory cells C10, C01, C21, C02, and C12 perform the refresh operation. The refresh operation of forming positive hole groups 9 by the impact ionization phenomenon is performed inside the channel regions 7 of the memory cells C10, C01, C21, C02, and C12 having "1" written therein in FIG. 6K. The threshold voltage of the first gate conductor layer 5a and the second gate conductor layer 5b of each of the memory cells C10, C01, C21, C02, and C12 is lowered, for example, by 1 V from 1.3 V in the "0" erase state to 0.3 V in the "1" write state. Accordingly, by inputting a voltage lower than the voltage during the "1" write operation to the plate lines PL0 to PL2 and the word lines WL0 to WL2, the refresh operation of forming the positive hole groups 9 by the impact ionization phenomenon inside the channel regions 7 of the memory cells C10, C01, C21, C02, and C12 can be performed. Here, referring to FIG. 6J, a case is expected where the voltage of the channel regions 7 of the memory cells C10, C01, C21, C02, and C12 having "1" written therein is slightly lowered from the first data holding voltage $V_{FB}$"1" to $V_{FB}$"1"$-\Delta V_{FB}$.

The refresh operation for all the word lines WL in the memory cell block illustrated in FIG. 6K is very effective during a page sum-of-product read operation (an example of a "page sum-of-product read operation" in the claims) in which at least two of the word lines are multiple-selected. During the page sum-of-product read operation, for example, three word lines WL0 to WL2 are multiple-selected in FIG. 6B. The memory cell current Icell of the word lines WL0 to WL2 are added in the bit lines BL0 to BL2. Hence, it is required to read saturated and stable memory cell current as the memory cell current. Thus, the refresh operation relating to all the word lines WL in the memory cell block in FIG. 6J before the page sum-of-product read operation is very effective.

Figure 6L:
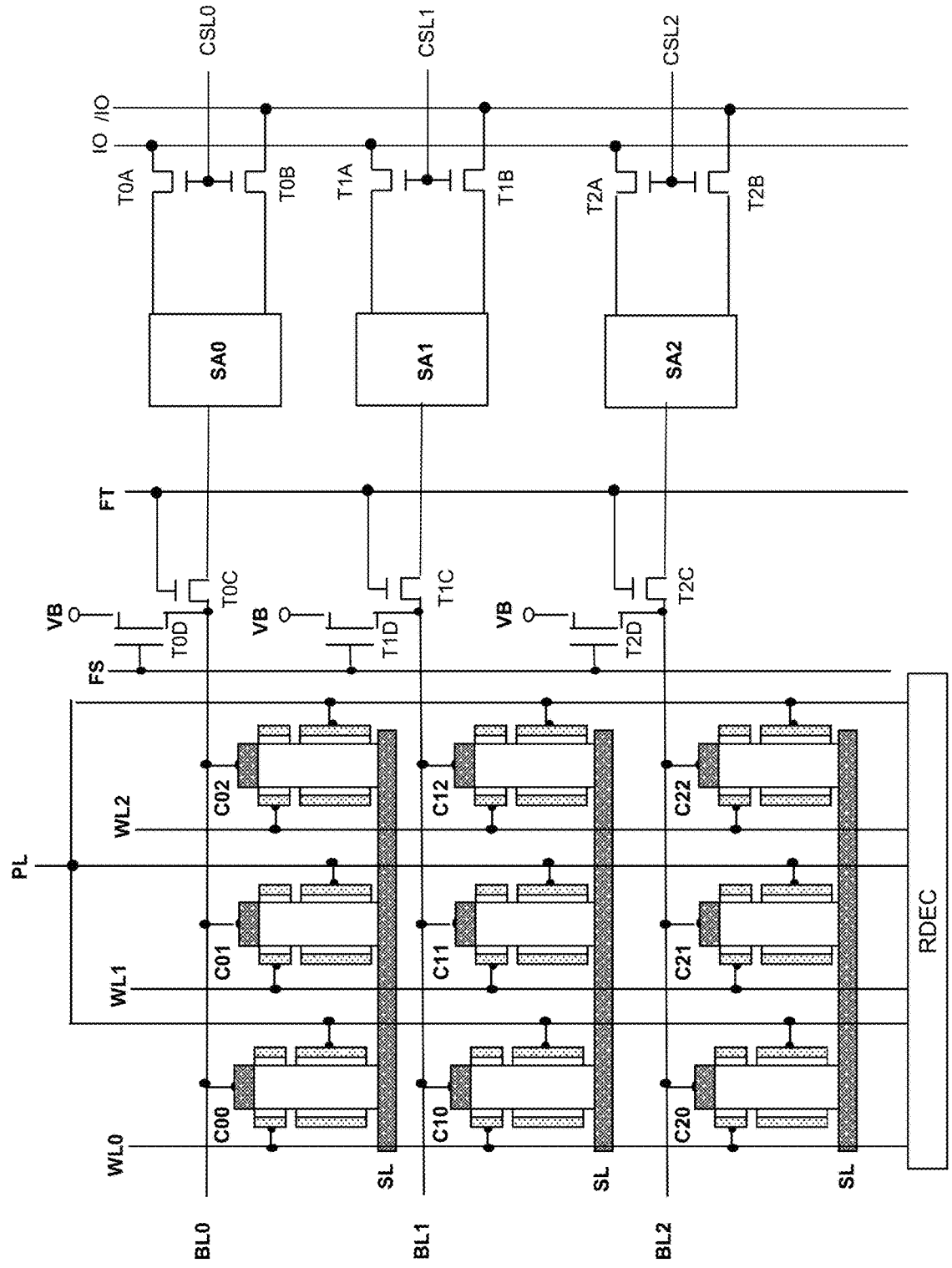
FIG. 6L is a circuit block diagram for explaining the refresh operation before the page read operation of the memory device having the SGT according to the first embodiment.

FIG. 6L illustrates, in the block of the memory cells C00 to C22 arranged in three rows by three columns, an example in which a plate line PL is shared by adjacent memory cells. Also with this configuration, it is possible to perform the refresh operation of the dynamic flash memory cell according to the first embodiment of the present invention before the page reading.

Figure 6M:
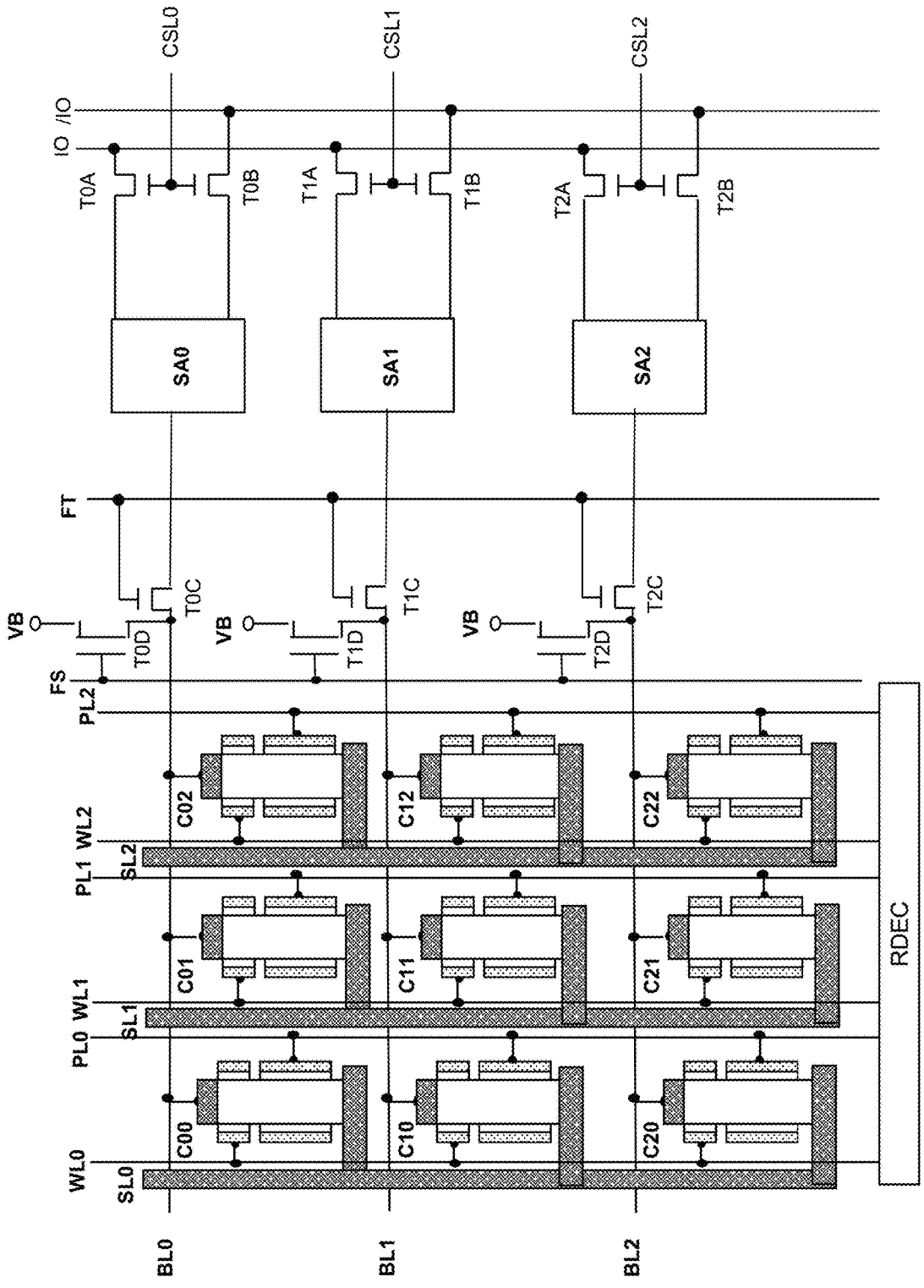
FIG. 6M is a circuit block diagram for explaining the refresh operation before the page read operation of the memory device having the SGT according to the first embodiment.
Figure 7B:
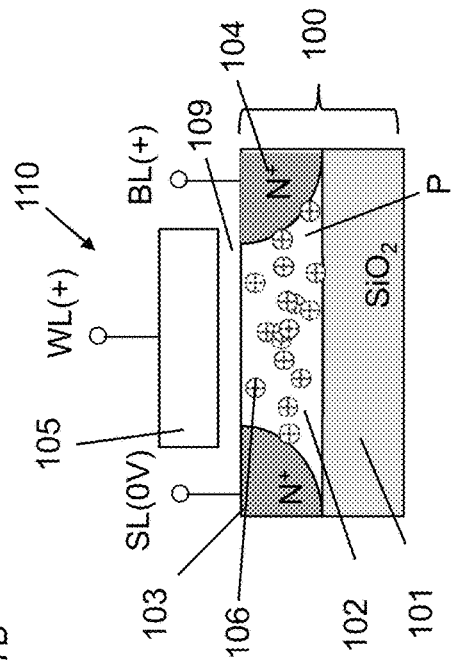
FIGS. 7A, 7B, 7C, and 7D are diagrams for explaining a write operation of a capacitorless DRAM memory cell according to related art.
Figure 7A:
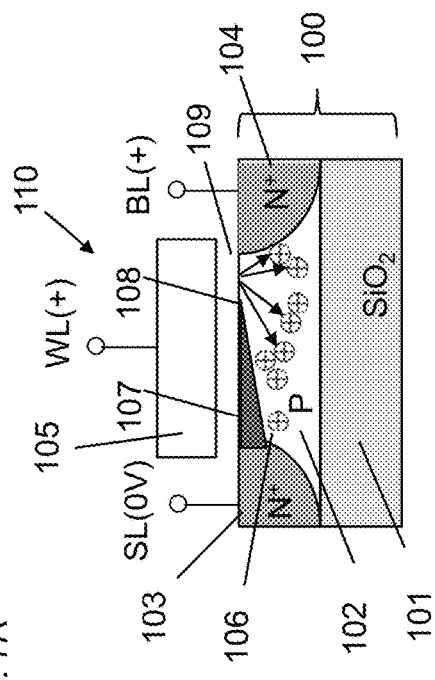
Figure 7C:
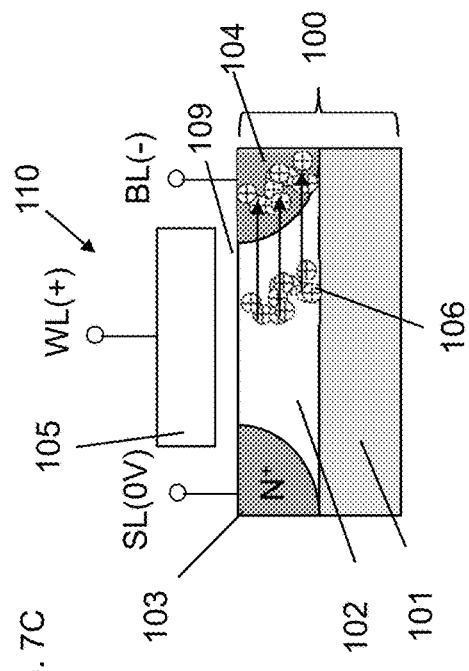
Figure 7D:
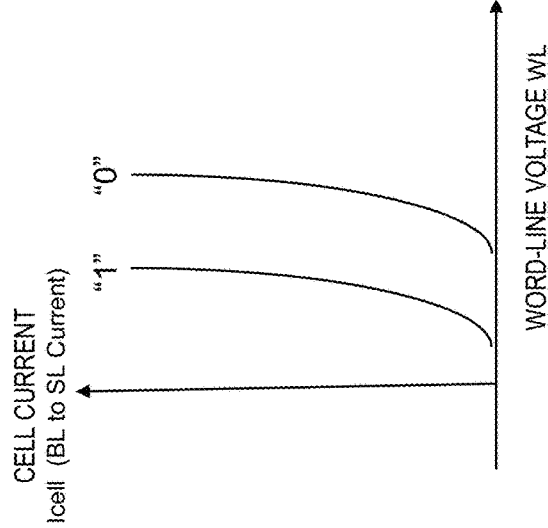
Figure 8A:
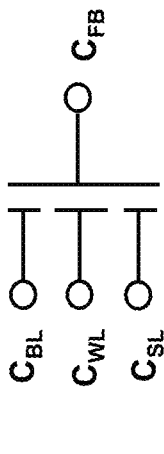
FIGS. 8A and 8B are diagrams for explaining a problem in an operation of the capacitorless DRAM memory cell according to the related art.
Figure 8B:
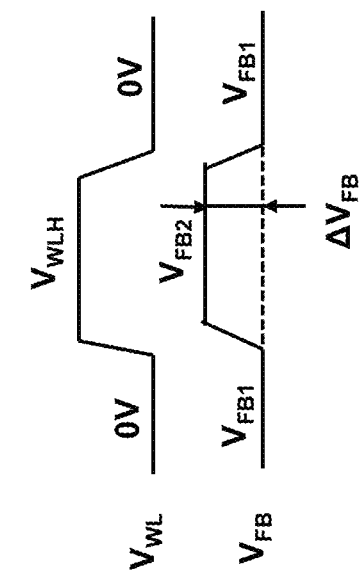

FIG. 6M illustrates, in the block of the memory cells C00 to C22 arranged in three rows by three columns, an example in which source lines are separated and arranged, the source lines including a source line SL0 parallel to a plate line PL0 and a word line WL0, a source line SL1 parallel to a plate line PL1 and a word line WL1, and a source line SL2 parallel to a plate line PL2 and a word line WL2. Also with this configuration, it is possible to perform the refresh operation of the dynamic flash memory cell according to the first embodiment of the present invention before the page reading.

In FIG. 1, the Si pillar 2 may have a horizontal sectional shape being circular, elliptic, or rectangular. With such a horizontal sectional shape, it is possible to perform the dynamic flash memory operation described in the present embodiment. Moreover, dynamic flash memory cells having a circular shape, an elliptic shape, and a rectangular shape may be disposed in a mixed manner on the same chip.

In FIG. 1, the dynamic flash memory element has been described with the example of the SGT in which the first gate insulating layer 4a and the second gate insulating layer 4b surrounding the whole side surface of the Si pillar 2 standing on the substrate in the vertical direction are provided, and the first gate conductor layer 5a and the second gate conductor layer 5b surrounding the whole first gate insulating layer 4a and second gate insulating layer 4b are provided. As described in the present invention, the dynamic flash memory element may have any structure as long as the structure satisfies the condition that the positive hole group 9 generated by the impact ionization phenomenon is held in the channel region 7. To attain the structure, the channel region 7 at least has the floating body structure isolated from the substrate 1. Accordingly, even when a semiconductor body of a channel region is formed horizontally to the substrate 1 by using a gate all around (GAA) technology (for example, see E. Yoshida and T. Tanaka: "A design of a capacitorless 1T-DRAM cell using gate-induced drain leakage (GIDL) current for low-power and high-speed embedded memory", IEEE IEDM, pp. 913-916, December 2003 which is one of SGTs or a nanosheet technology (for example, see J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006), it is possible to perform the above-described dynamic flash memory operation. Also, a device structure using a silicon on insulator (SOI) (for example, see J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006); and E. Yoshida and T. Tanaka: "A design of a capacitorless 1T-DRAM cell using gate-induced drain leakage (GIDL) current for low-power and high-speed embedded memory" IEEE IEDM, pp. 913-916, December 2003) may be employed. With the device structure, a bottom portion of a channel region is in contact with an insulating layer of a SOI substrate. Also, a gate insulating layer and an element separation insulating layer surround another channel region. Also with this structure, the channel region has a floating body structure. As described above, with the dynamic flash memory element provided by the present embodiment, the condition that the channel region has the floating body structure is at least satisfied. Moreover, even with a structure in which a Fin transistor (for example, see H. Jiang, N. Xu, B. Chen, L. Zengl, Y. He, G. Du, X. Liu and X. Zhang: "Experimental investigation of self-heating effect (SHE) in multiple-fin SOI FinFETs", Semicond. Sci. Technol. 29 (2014) 115021 (7pp)) is formed on a SOI substrate, as long as the channel region has the floating body structure, it is possible to perform the dynamic flash operation.

Also, Expressions (1) to (12) in the present specification and the drawings are expressions used for qualitatively explaining the phenomena. The phenomena are not limited by the expressions.

In the description in FIGS. 3AA to 3B, the reset voltage of the word line WL, the bit line BL, and the source line SL is $V_{SS}$; however, the reset voltage may be different voltages.

In FIG. 4A and its description, the example of the page erase operation conditions has been provided. In contrast, the voltages to be applied to the source line SL, the plate line PL, the bit line BL, and the word line WL may be changed as long as the state of discharging the positive hole group 9 in the channel region 7 from one or both of the N$^+$ layer 3a and the N$^+$ layer 3b. In the page erase operation, a voltage may be applied to the source line SL of the selected page and the bit line BL may be in a floating state. In the page erase operation, a voltage may be applied to the bit line BL of the selected page and the source line SL may be in a floating state.

Referring to FIG. 1, in the channel region 7 of the portion surrounded by the insulating layer 6 that is the first insulating layer, the potential distribution of the first channel region 7a and the potential distribution of the second channel region 7b are formed in a connected manner in the vertical direction. Accordingly, the channel regions 7 of the first channel region 7a and the second channel region 7b are connected in the vertical direction in the region surrounded by the insulating layer 6 that is the first insulating layer.

In FIG. 1, the length in the vertical direction of the first gate conductor layer 5a connected to the plate line PL is desirably further larger than the length in the vertical direction of the second gate conductor layer 5b connected to the word line WL. That is, $C_{PL} > C_{WL}$ is desirable. However, only by adding the plate line PL, the coupling ratio ($C_{WL}(C_{PL} + C_{WL} + C_{BL} + C_{SL})$) of the capacitive coupling of the word line WL to the channel region 7 is decreased. Consequently, the potential variation $\Delta V_{FB}$ of the channel region 7 of the floating body is decreased.

In the operation waveform chart of FIG. 6C, the voltages of the bit line BL, the word line WL, and the plate line PL are specifically described. However, the voltages may be any voltages as long as the voltages satisfy a voltage condition that causes the impact ionization phenomenon to be generated in the channel region 7 with memory cell current and enable the refresh operation for forming the positive hole group 9.

As the voltage $V_{PLL}$ of the plate line PL, for example, a fixed voltage of about 1 V may be applied.

The meaning of the word "surround" (cover) when used as "a gate insulating layer, a gate conductor layer, or the like surrounds (covers) a channel or the like" in the specification and the claims include a case of surrounding the whole like a SGT or a GAA, a case of surrounding except for a portion like a Fin transistor, and a case of overlapping a planar object like a planar transistor.

In FIG. 1, the first gate conductor layer 5a surrounds the whole of the first gate insulating layer 4a. In contrast, the first gate conductor layer 5a may have a structure surrounding a portion of the first gate insulating layer 4a in plan view. The first gate conductor layer 5a is divided into at least two gate conductor layers and the divided gate conductor layers may operate as a plate line PL electrode. Likewise, the second gate conductor layer 5b may be divided into two or more gate conductor layers, and the divided gate conductor layers may operate as conductive electrodes of word lines synchronously or asynchronously. Accordingly, the dynamic flash memory operation can be performed.

Also, in FIG. 1, the first gate conductor layer 5a may be connected to the word line WL, and the second gate conductor layer 5b may be connected to the plate line PL. Also, with the configuration, the above-described dynamic flash memory operation can be performed.

In FIGS. 6A to 6J, the refresh operation of the one-bit dynamic flash memory cell consisting of one semiconductor body has been described. However, the present invention is effective for a refresh operation of a one-bit high-speed dynamic flash memory cell consisting of two semiconductor bodies that store complementary data of "1" and "0".

In FIGS. 6A to 6M, the refresh operation in the single-layer memory array of the one-bit dynamic flash memory cells each consisting of one semiconductor body has been described. However, the present invention is effective for a multilayer memory array in which one-bit dynamic flash memory cells each consisting of one semiconductor body are stacked in multiple stages.

The present embodiment has features described below.

Feature 1

In a dynamic flash memory cell of the present embodiment, N$^+$ layers 3a and 3b serving as a source and a drain, a channel region 7, a first gate insulating layer 4a, a second gate insulating layer 4b, a first gate conductor layer 5a, and a second gate conductor layer 5b are formed in a pillar shape as a whole. The N$^+$ layer 3a serving as the source is connected to a source line SL, the N$^+$ layer 3b serving as the drain is connected to a bit line BL, the first gate conductor layer 5a is connected to a plate line PL, and the second gate conductor layer 5b is connected to a word line WL. The feature structure is that the gate capacitance of the first gate conductor layer 5a connected to the plate line PL is larger than the gate capacitance of the second gate conductor layer 5b connected to the word line WL. In this dynamic flash memory cell, the first gate conductor layer 5a and the second gate conductor layer 5b are stacked in the vertical direction. Accordingly, even when the gate capacitance of the first gate conductor layer 5a connected to the plate line PL is larger than the gate capacitance of the second gate conductor layer 5b connected to the word line WL, the memory cell area is not increased in plan view. Thus, an increase in performance and an increase in integration of the dynamic flash memory cell can be simultaneously provided.

Feature 2

In a refresh operation of the dynamic flash memory cell according to the first embodiment of the present invention, a positive hole group 9 lost by leak current or the like can be returned to a "1" write state again by an impact ionization phenomenon inside a channel region 7 of the memory cell. Moreover, the refresh operation can be performed in parallel to a page read operation. Consequently, a complete read non-destructive memory can be provided. Furthermore, by repeating a read operation of the same page for the purpose of the refresh operation, the memory cell current is increased, so that it is possible to provide a higher-speed, stable, and highly reliable memory device.

Feature 3

Focusing on the function of the first gate conductor layer 5a connected to the plate line PL in the dynamic flash memory cell according to the first embodiment of the present invention, the voltage of the word line WL oscillates up and down when the dynamic flash memory cell performs write and read operations. At this time, the plate line PL plays a role of reducing the capacitive coupling ratio between the word line WL and the channel region 7. Consequently, when the voltage of the word line WL oscillates up and down, the influence of the change in voltage of the channel region 7 can be markedly suppressed. Thus, the difference in threshold voltage between SGT transistors of the word lines WL indicating a logic "0" and a logic "1" can be increased. This leads to an increase in operation margin of the dynamic flash memory cell. During data reading of the logic "0", the voltage to be applied to the first gate conductor layer 5a connected to the plate line PL is set to be higher than a threshold voltage at the time of logic storage data "1" and to be lower than a threshold voltage at the time of logic storage data "0", thereby obtaining a characteristic that no current flows even when the voltage of the word line WL is increased. This leads to a further increase in the operation margin of the dynamic flash memory cell.

Other Embodiments

Although the Si pillar is formed in the present invention, a semiconductor pillar made of a semiconductor material other than Si may be formed. This also applies to the other embodiments according to the present invention.

Various embodiments and modifications can be made for the present invention without departing from the broad spirit and scope of the present invention. In addition, each of the above-described embodiments is for describing an example of the present invention, and does not limit the scope of the present invention. Any of the embodiments and modifications described above can be desirably combined. Furthermore, even when some of the constituent elements of the above-described embodiment are removed as necessary, it is within the scope of the technical idea of the present invention.

According to the memory device using the semiconductor element of the present invention, a dynamic flash memory which is a memory device using a SGT having high density and high performance can be obtained.

What is claimed is:

1. A memory device using a semiconductor element, the memory device in which a plurality of memory cells arranged in a row direction on a substrate constitute a page, and a plurality of the pages arranged in a column direction constitute a memory block,
    each of the memory cells included in each of the pages comprising a columnar semiconductor body positioned on the substrate, wherein the columnar semiconductor body comprises:
        a columnar channel semiconductor layer having a length in a longitudinal direction and formed entirely of a single floating body structure electrically isolated from the substrate, wherein the single floating body structure is formed to have a single conductivity type throughout the single floating body structure;
        a first impurity layer and a second impurity layer formed, respectively, at longitudinal ends of the columnar channel semiconductor layer;
        a first gate insulating layer formed in the longitudinal direction around a side surface of the columnar channel semiconductor layer and formed in contact with or close to the first impurity layer;
        a second gate insulating layer formed in the longitudinal direction around the side surface of the columnar channel semiconductor layer in contact with or in close proximity to the second impurity layer, wherein the second gate insulating layer is connected in series in the longitudinal direction to the first gate insulating layer;
        a first gate conductor layer formed around the first gate insulating layer;
        a second gate conductor layer formed, separately from the first gate conductor layer, around the second gate insulating layer; and
        an operation circuit configured to selectively operate each of the plurality of memory cells and having a source line connected to the first impurity layer, a bit line connected to the second impurity layer, a word line connected to one of the first gate conductor layer or the second gate conductor layer and a drive control line connected to the other of the first gate conductor layer or the second gate conductor layer, the bit line being connected to a sense amplifier circuit via a switch circuit,
    wherein the operation circuit is configured to apply voltages to the word line, the drive control line, the source line and the bit line to form by an impact ionization phenomenon and hold a positive hole group inside the columnar channel semiconductor layer,
    wherein the operation circuit is configured to, during a page write operation, set a voltage of the columnar channel semiconductor layer equal to a first data holding voltage that is higher than at least one of a voltage of the first impurity layer or a voltage of the second impurity layer,
    wherein the operation circuit is configured to, during a page erase operation, apply voltages to the source line, the bit line, the word line, and the drive control line to discharge the positive hole group from the columnar channel semiconductor layer through at least one of the first impurity layer and the second impurity layer and to set the voltage of the columnar channel semiconductor layer equal to a second data holding voltage that is lower than the first data holding voltage, and
    wherein the operation circuit is configured to, before a page read operation, in which page data is read through the bit line from a group of the memory cells selected with at least one of the word lines, perform a refresh operation at least once, in which the voltage of the columnar channel semiconductor layer of the selected memory cells is returned to the first data holding voltage through formation of the positive hole group caused by the impact ionization phenomenon inside the channel semiconductor layer.

2. The memory device using the semiconductor element according to claim 1, wherein the operation circuit further comprises a row decoder circuit, wherein the row decoder circuit is configured to, during the refresh operation, receive a word-line all select signal selects all the word lines in the memory cell block.

3. The memory device using the semiconductor element according to claim 1, wherein the drive control line runs commonly to adjacent memory cells.

4. The memory device using the semiconductor element according to claim 1, wherein the operation circuit is configured to set the switch circuit to a non-conductive state, in which the page data is written in the sense amplifier circuit during the refresh operation, the page erase operation of the first page is performed before the refresh operation is ended, and set the switch circuit to a conductive state, in which the page write operation of writing the page data of the sense amplifier circuit in the first memory cell group is performed.

5. The memory device using the semiconductor element according to claim 1, wherein a first gate capacitance between the first gate conductor layer and the columnar channel semiconductor layer is larger than a second gate capacitance between the second gate conductor layer and the columnar channel semiconductor layer.

6. The memory device using the semiconductor element according to claim 1, wherein the first gate conductor layer is separated into at least two conductor layers arranged in the longitudinal direction.

7. The memory device using the semiconductor element according to claim 1, wherein the operation circuit is configured to provide a first pulse width of the word line and the bit line during the refresh operation provide a second pulse width of the word line and the bit line during the page read operation, the first pulse width being wider than the second pulse width.

8. The memory device using the semiconductor element according to claim 1, wherein the operation circuit is configured to cause the impact ionization phenomenon to take place inside the columnar channel semiconductor layer between the first gate conductor layer and the second gate conductor layer to generate the positive hole group inside the columnar channel semiconductor layer.

9. The memory device using the semiconductor element according to claim 1, wherein the operation circuit is configured to, during a page sum-of-product read operation in which at least two of the word lines are selected simultaneously, perform the refresh operation at least once in advance for the word lines being selected simultaneously in the page sum-of-product read operation.

* * * * *